United States Patent
Huang et al.

(10) Patent No.: US 10,283,417 B1
(45) Date of Patent: May 7, 2019

(54) SELF-PROTECTIVE LAYER FORMED ON HIGH-K DIELECTRIC LAYERS WITH DIFFERENT MATERIALS

(71) Applicant: Taiwan Semiconductor Manufacturing Co., Ltd., Hsinchu (TW)

(72) Inventors: Ju-Li Huang, Mingjian (TW); Ying-Liang Chuang, Zhubei (TW); Ming-Hsi Yeh, Hsinchu (TW); Kuo-Bin Huang, Jhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/833,721

(22) Filed: Dec. 6, 2017

Related U.S. Application Data

(60) Provisional application No. 62/527,806, filed on Jun. 30, 2017.

(51) Int. Cl.
*H01L 29/49* (2006.01)
*H01L 29/51* (2006.01)
(Continued)

(52) U.S. Cl.
CPC ........... *H01L 21/823857* (2013.01); *H01L 21/02175* (2013.01); *H01L 21/02181* (2013.01);
(Continued)

(58) Field of Classification Search
CPC ............ H01L 27/0924; H01L 29/4966; H01L 29/517; H01L 29/518; H01L 29/66545
See application file for complete search history.

(56) References Cited

U.S. PATENT DOCUMENTS 8,836,049 B2 * 9/2014 Tsai .................. H01L 21/28088
257/412
8,846,513 B2 * 9/2014 Baars ................ H01L 29/66545
257/E21.409
(Continued)

FOREIGN PATENT DOCUMENTS

TW           201543552 A        11/2015

OTHER PUBLICATIONS

Khalafi-Nehad et al; Silica boron-sulfuric acid nanoparticles (SBSANs): preparation, characterization and their catalytic application in the Ritter reaction for the synthesis of amide derivatives; J. Mater. Chem., 2011, 21, 12842.
(Continued)

*Primary Examiner* — Ida M Soward
(74) *Attorney, Agent, or Firm* — Slater Matsil, LLP

(57) ABSTRACT

Semiconductor device structures having metal gate structures with tunable work function values are provided. In one example, a semiconductor device includes a first gate structure and a second gate structure on a substrate; wherein the first gate structure includes a first gate dielectric layer having a first material, and the second gate structure includes a second gate dielectric layer having a second material, the first material being different from the second material, wherein the first and the second gate structures further includes a first and a second self-protective layers disposed on the first and the second gate dielectric layers respectively, wherein the first self-protective layer includes metal phosphate and the second self-protective layer includes boron including complex agents and a first work function tuning layer on the first self-protective layer in the first gate structure.

20 Claims, 29 Drawing Sheets

(51) Int. Cl.
*H01L 29/66* (2006.01)
*H01L 21/8238* (2006.01)
*H01L 27/092* (2006.01)
*H01L 21/02* (2006.01)

(52) U.S. Cl.
CPC .. *H01L 21/02183* (2013.01); *H01L 21/02186* (2013.01); *H01L 21/02189* (2013.01); *H01L 21/823821* (2013.01); *H01L 21/823842* (2013.01); *H01L 27/0924* (2013.01); *H01L 29/4966* (2013.01); *H01L 29/517* (2013.01); *H01L 29/518* (2013.01); *H01L 29/66545* (2013.01)

(56) References Cited

U.S. PATENT DOCUMENTS

| | | | |
|---|---|---|---|
| 8,896,030 B2 * | 11/2014 | Mukherjee | H01L 21/823456 257/204 |
| 9,356,027 B1 * | 5/2016 | Cheng | H01L 27/0924 |
| 9,431,304 B2 | 8/2016 | Huang et al. | |
| 9,711,411 B2 * | 7/2017 | Lu | H01L 21/02164 |
| 9,721,840 B2 * | 8/2017 | Lai | H01L 21/28088 |
| 9,761,684 B2 * | 9/2017 | Huang | H01L 21/82385 |
| 9,799,566 B1 * | 10/2017 | Liao | H01L 21/82345 |
| 9,812,366 B2 * | 11/2017 | Huang | H01L 21/28088 |
| 9,905,476 B2 * | 2/2018 | Bao | H01L 27/0924 |
| 9,911,736 B1 * | 3/2018 | Zang | H01L 27/0886 |
| 9,947,540 B2 * | 4/2018 | Tsai | H01L 21/321 |
| 10,002,871 B2 * | 6/2018 | Ando | H01L 27/0924 |
| 10,170,317 B1 * | 1/2019 | Huang | H01L 21/28247 |
| 2010/0052066 A1 * | 3/2010 | Yu | H01L 21/823842 257/369 |
| 2013/0045594 A1 * | 2/2013 | Wang | H01L 21/823842 438/589 |
| 2013/0168816 A1 * | 7/2013 | Kang | H01L 27/0629 257/536 |
| 2014/0299937 A1 * | 10/2014 | Teo | H01L 21/823425 257/368 |
| 2015/0118395 A1 | 4/2015 | Gordon et al. | |
| 2016/0104673 A1 * | 4/2016 | Tung | H01L 21/76897 257/288 |
| 2016/0181163 A1 | 6/2016 | Huang et al. | |
| 2016/0365426 A1 * | 12/2016 | Ching | H01L 29/6656 |
| 2016/0372565 A1 | 12/2016 | Huang et al. | |
| 2017/0025514 A1 | 1/2017 | Wu et al. | |
| 2017/0263608 A1 * | 9/2017 | Gan | H01L 21/823842 |
| 2017/0309520 A1 * | 10/2017 | Liou | H01L 21/823456 |
| 2017/0373058 A1 * | 12/2017 | Tsau | H01L 27/0886 |
| 2018/0019242 A1 * | 1/2018 | Liao | H01L 27/0924 |
| 2018/0108748 A1 * | 4/2018 | Chen | H01L 29/4966 |
| 2018/0122701 A1 * | 5/2018 | Li | H01L 21/02112 |
| 2018/0226485 A1 * | 8/2018 | Jangjian | H01L 29/66545 |

OTHER PUBLICATIONS

Textor et al: Structural Chemistry of Self-Assembled Monolayers of Octadecylphosphoric Acid on Tantalum Oxide Surfaces; Langmuir 2000, 16, 3257-3271.

* cited by examiner

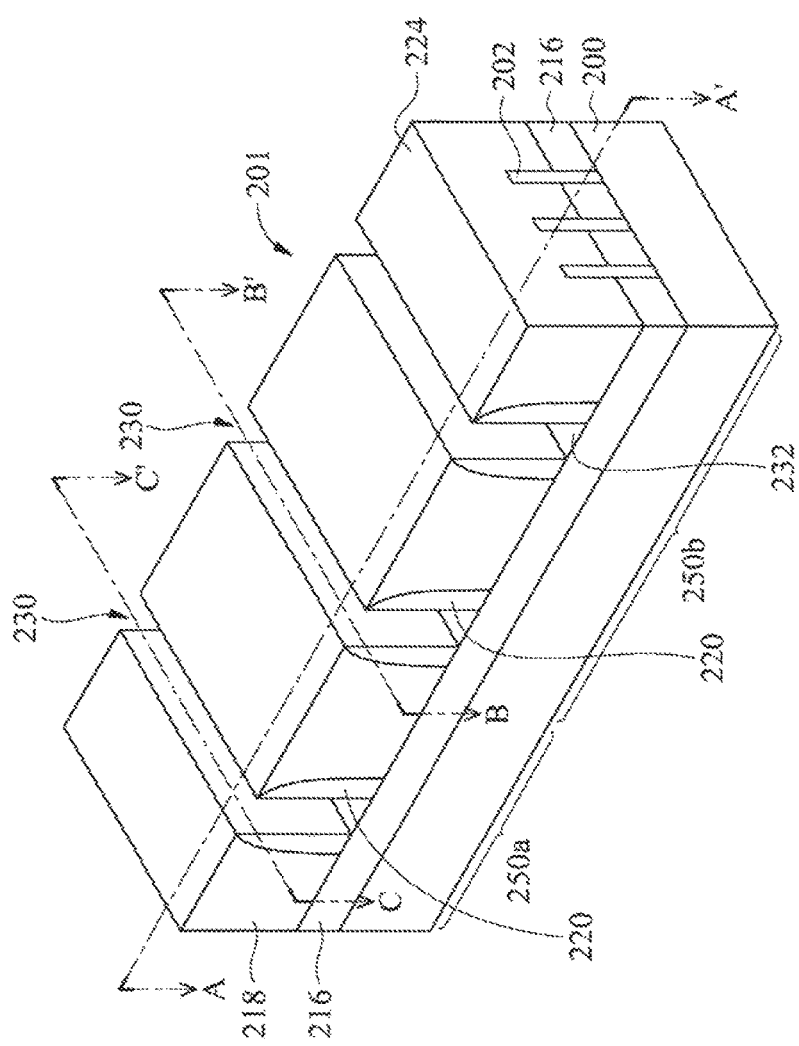
Figure 2C1

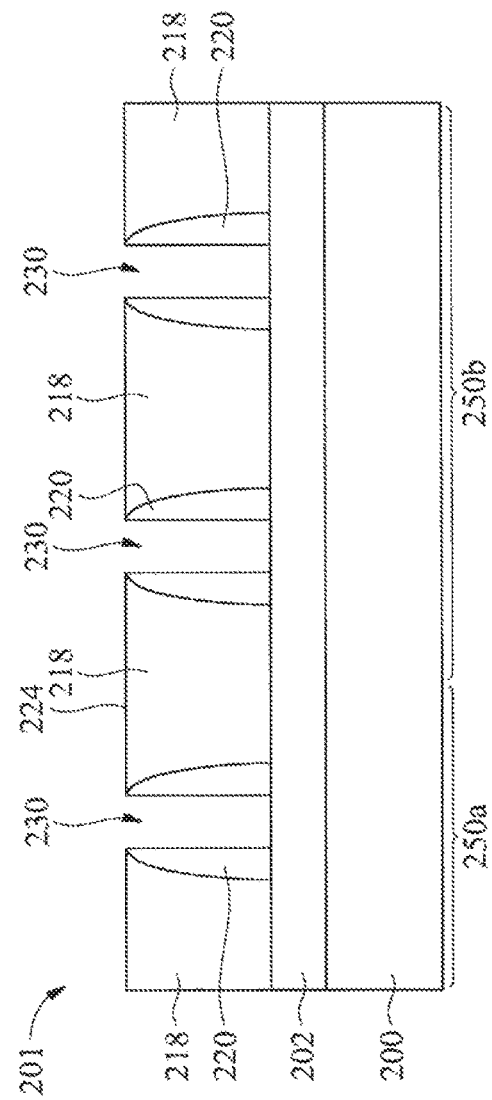
Figure 2C2

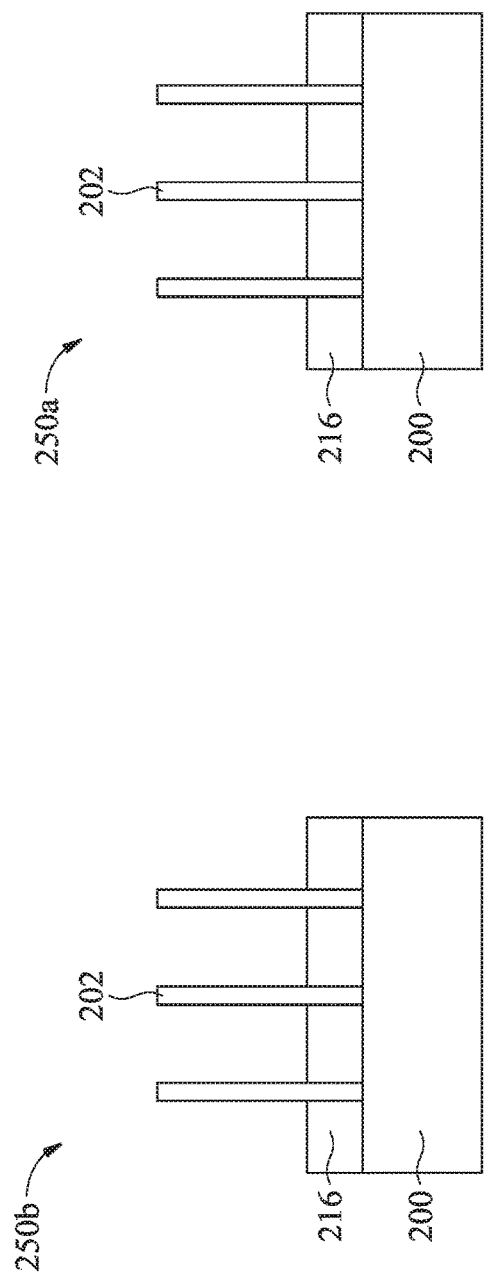

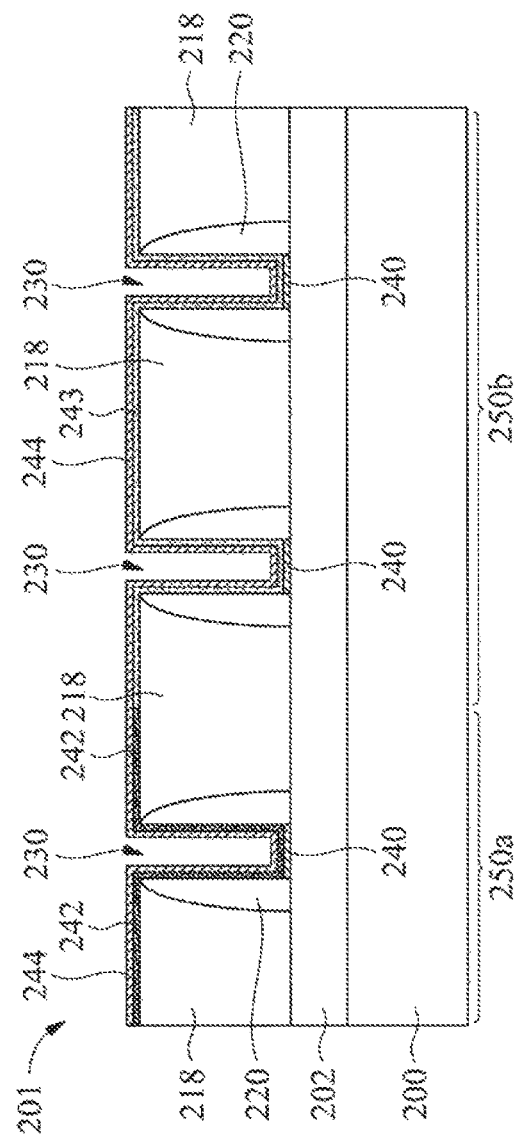
Figure 2D1

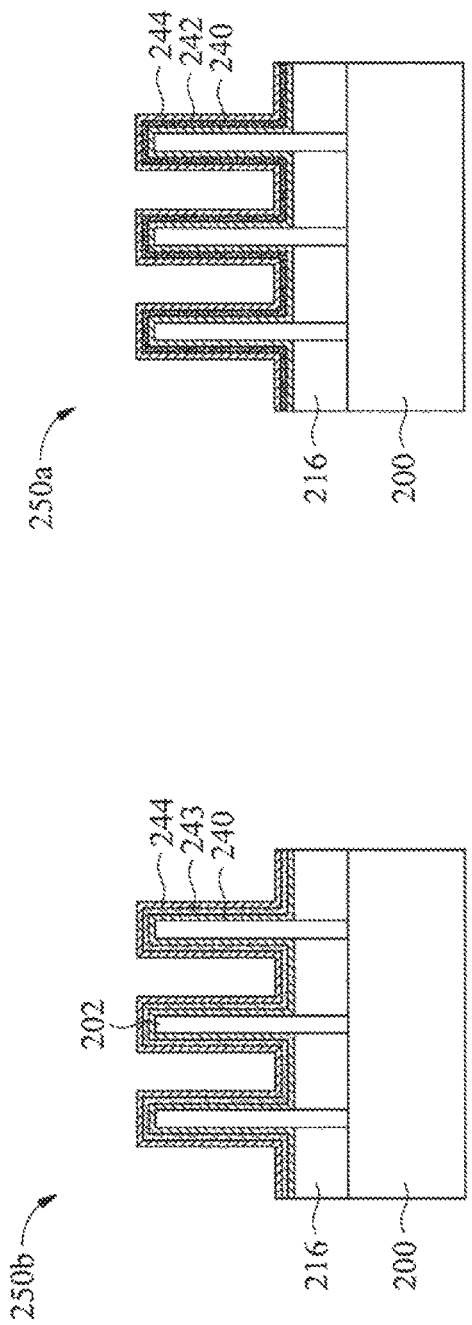

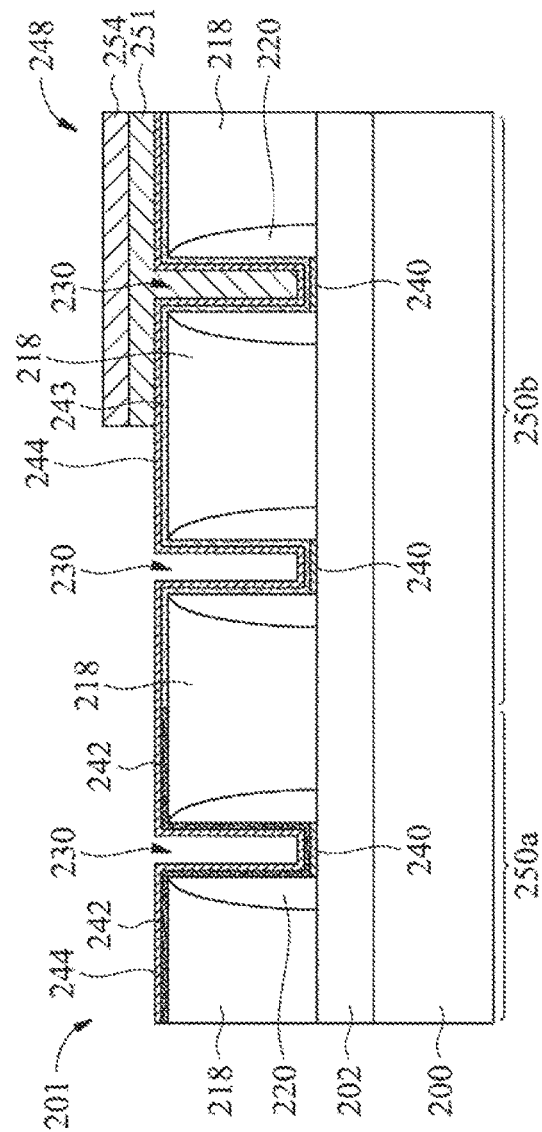
Figure 2E1

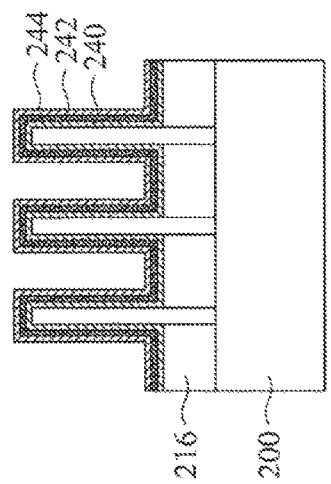
Figure 2E3
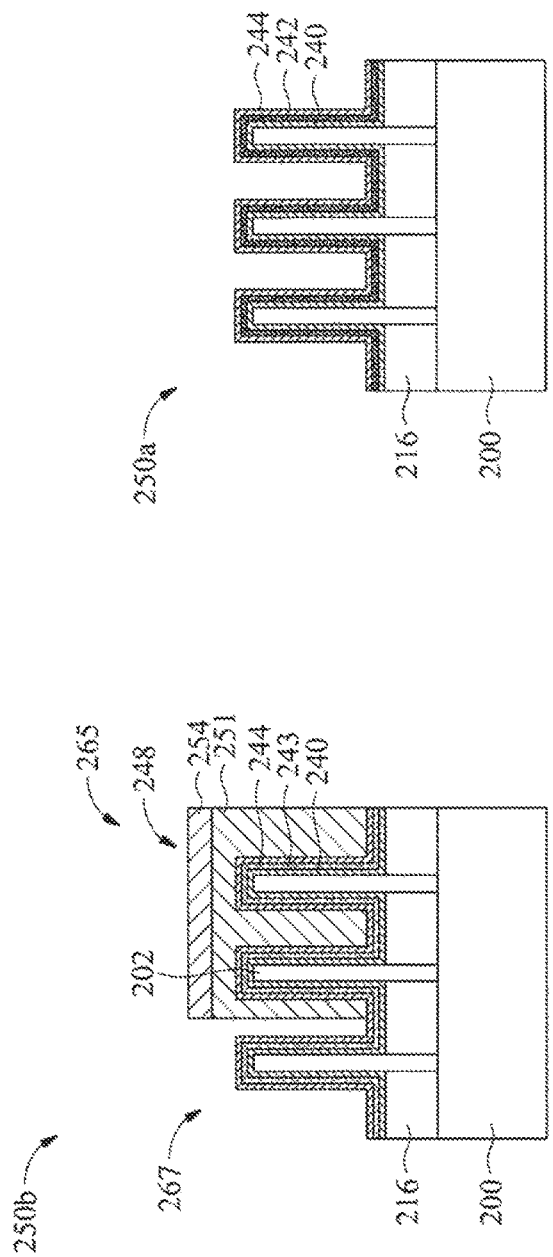
Figure 2E2

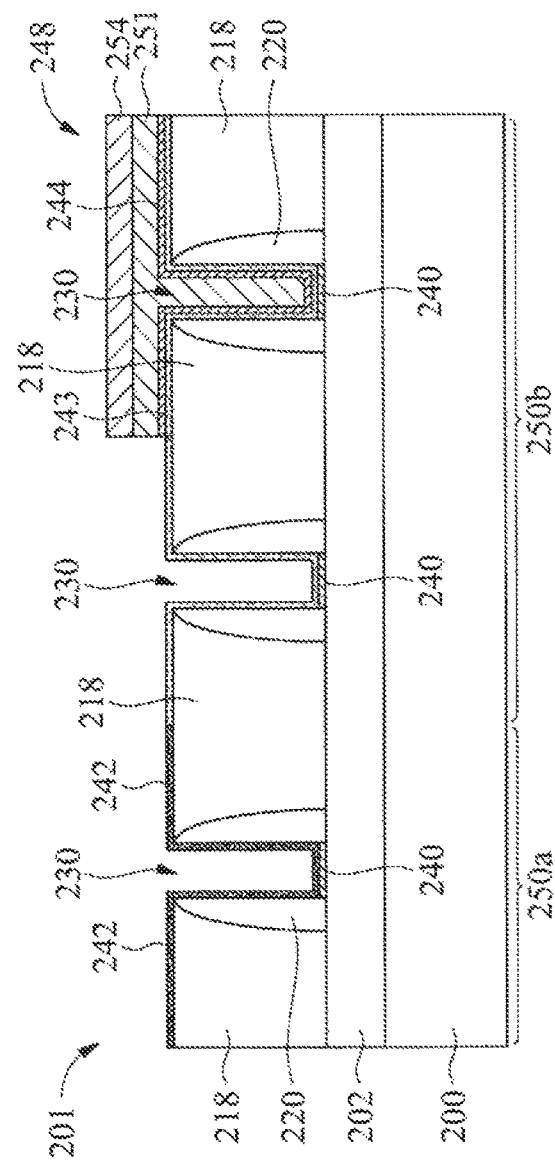
Figure 2F1

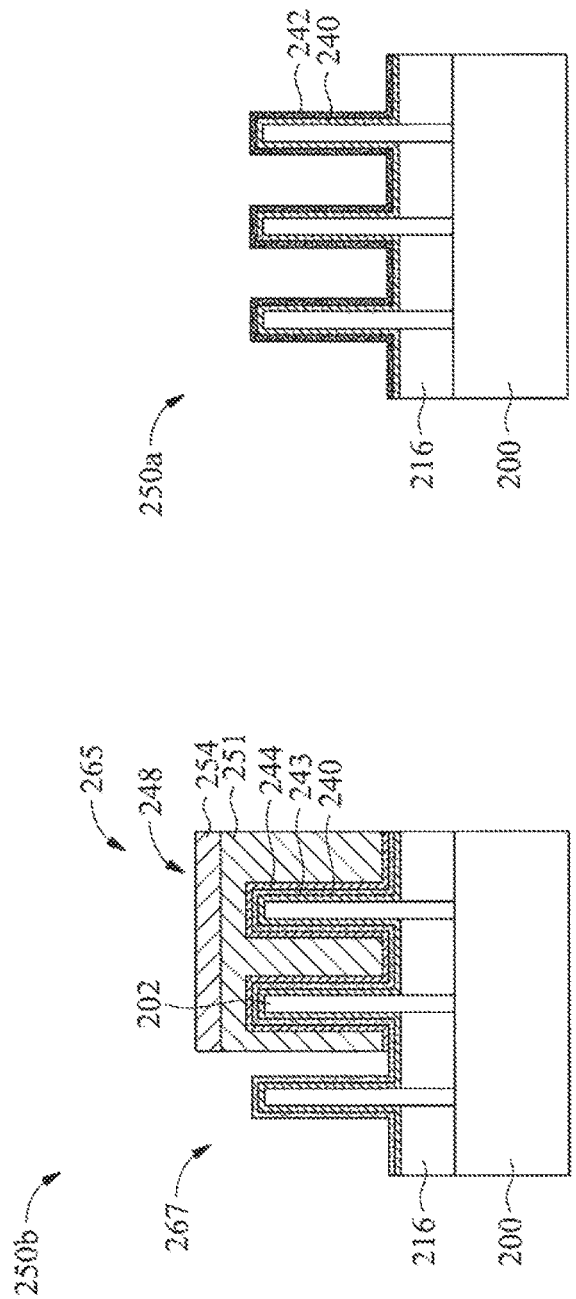

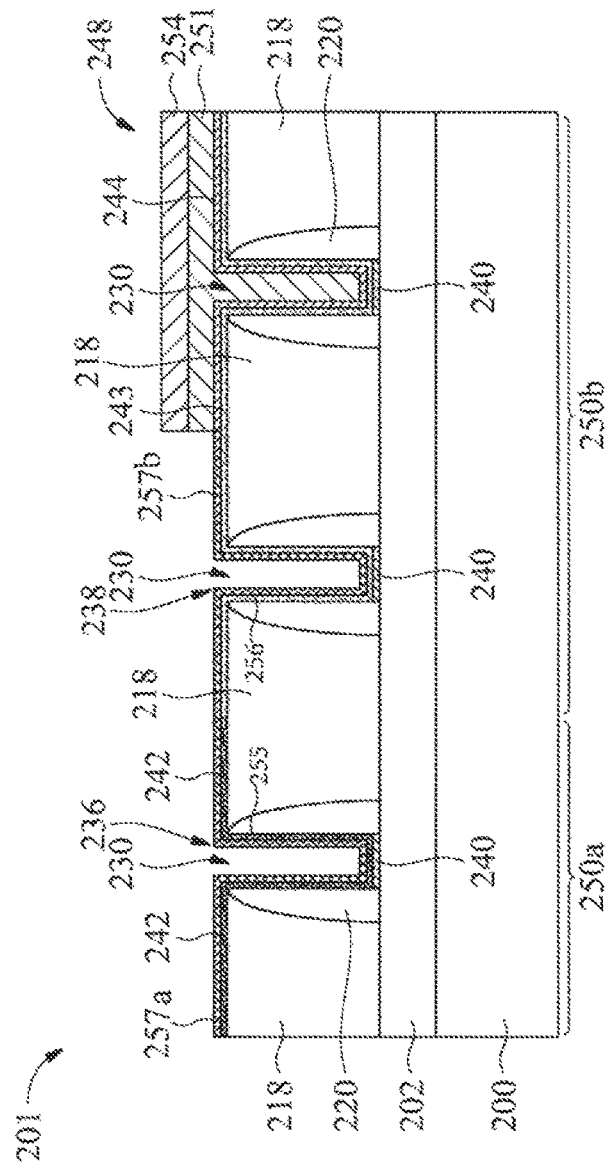
Figure 2G1

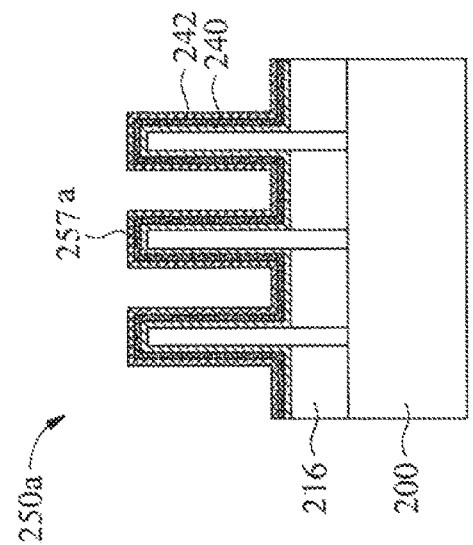
Figure 2G3
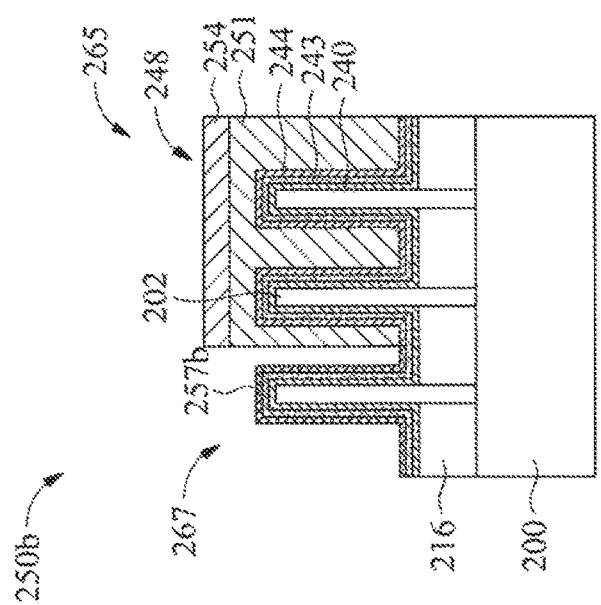
Figure 2G2

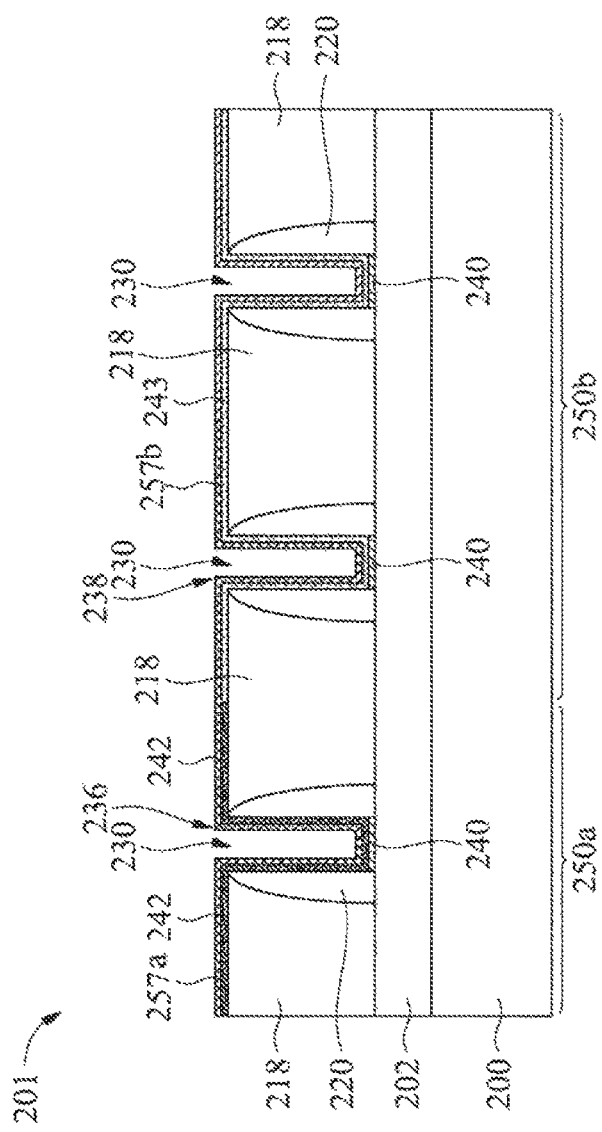
Figure 2H1

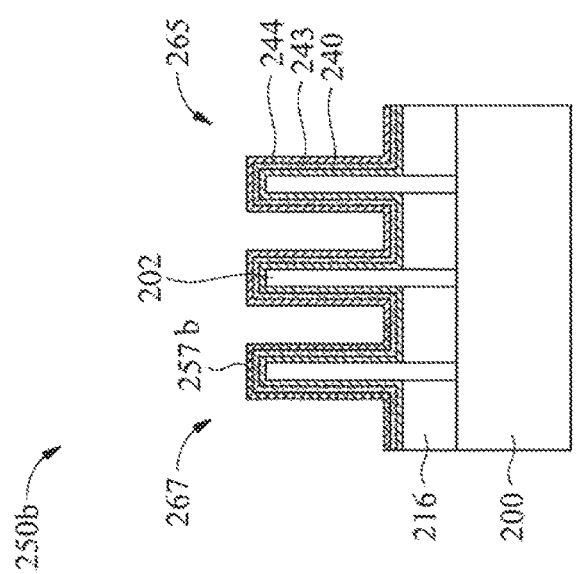
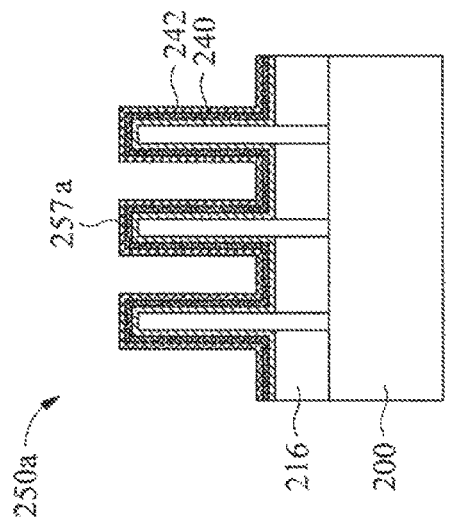
Figure 2H2
Figure 2H3

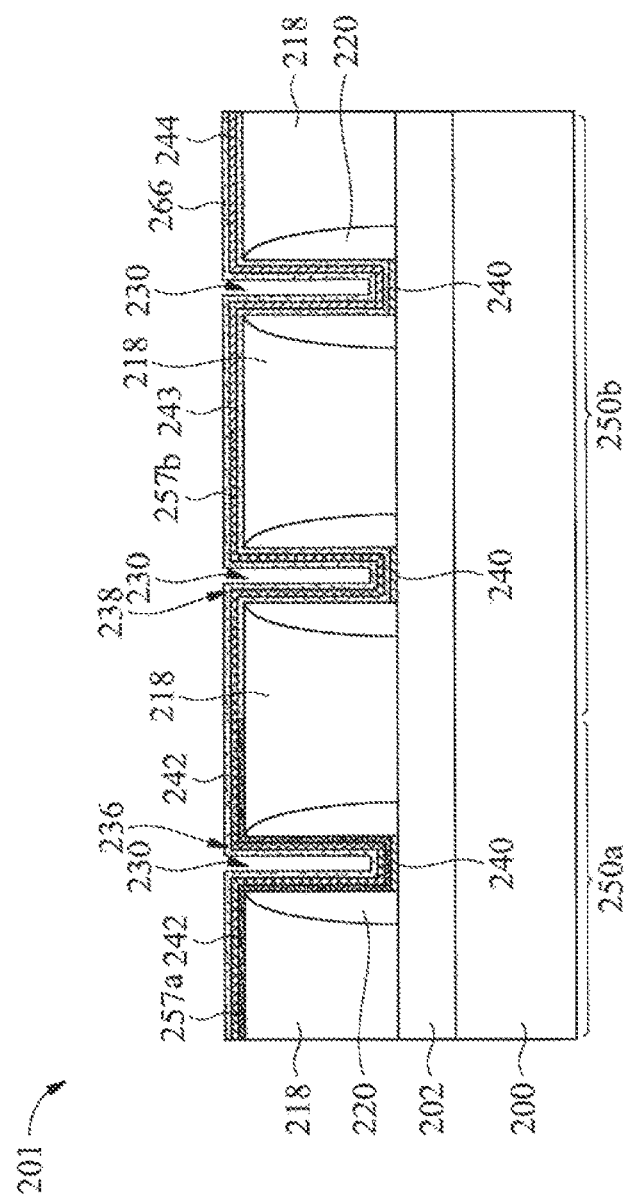
Figure 2I1

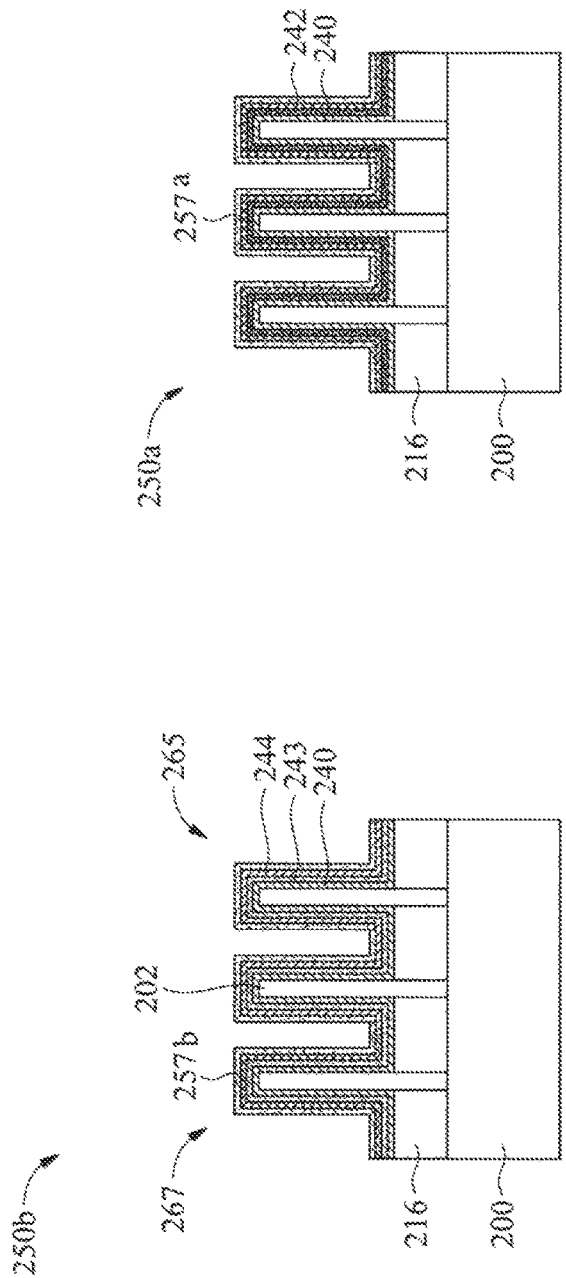

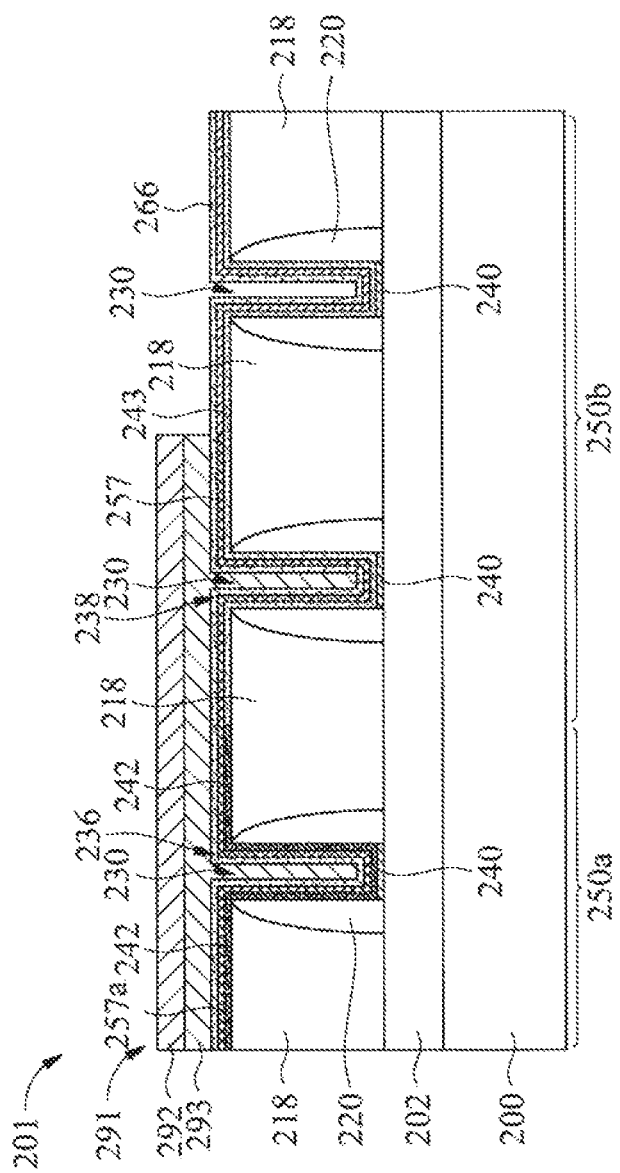
Figure 2J1

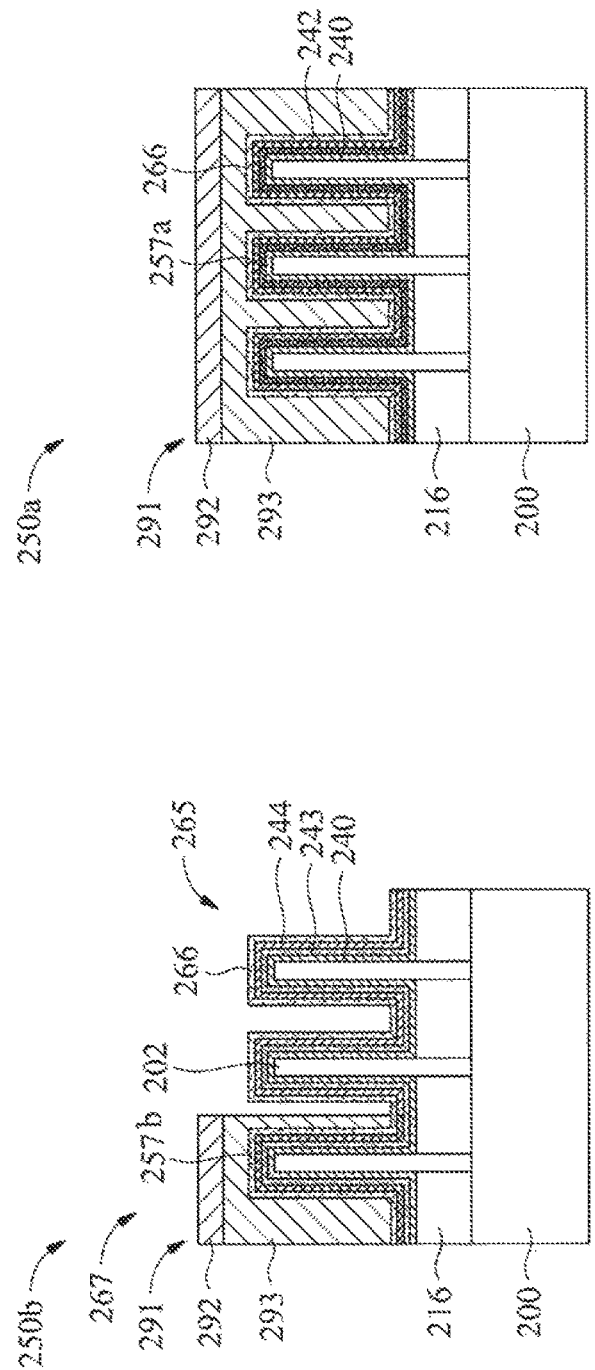
Figure 2J3
Figure 2J2

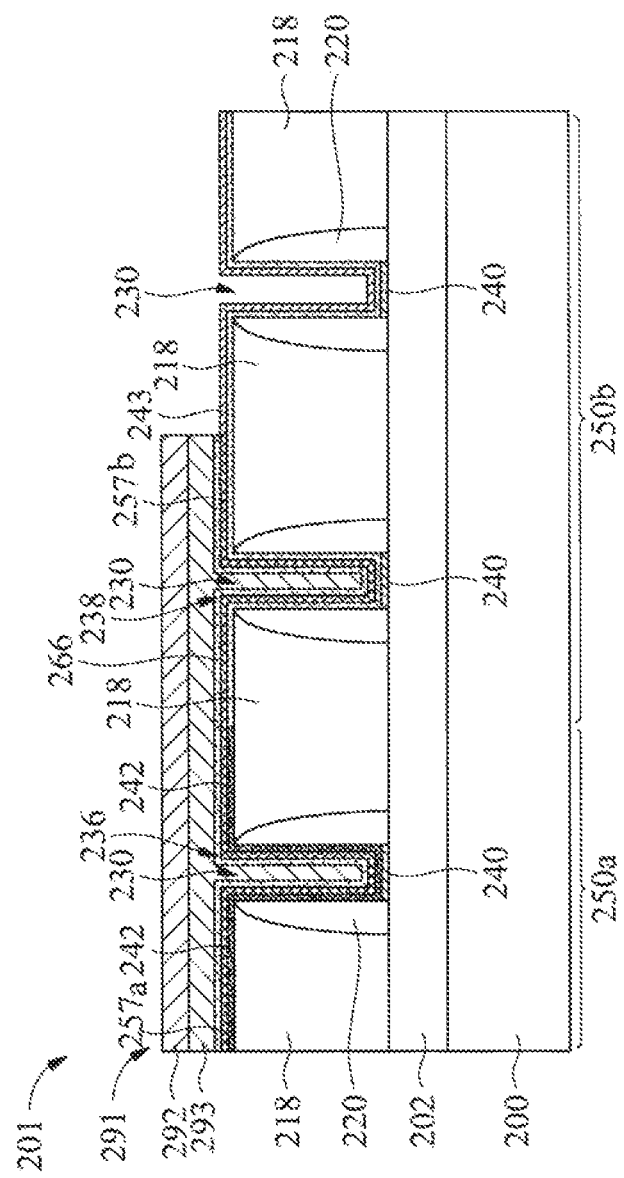
Figure 2K1

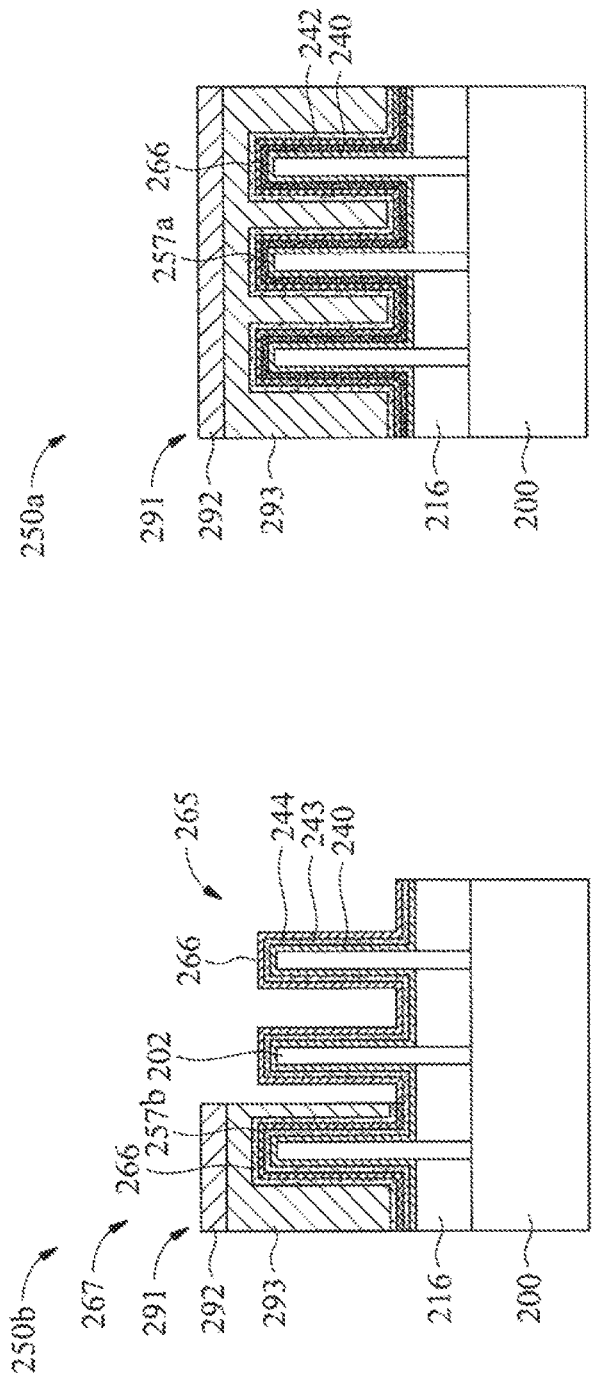
Figure 2K2
Figure 2K3

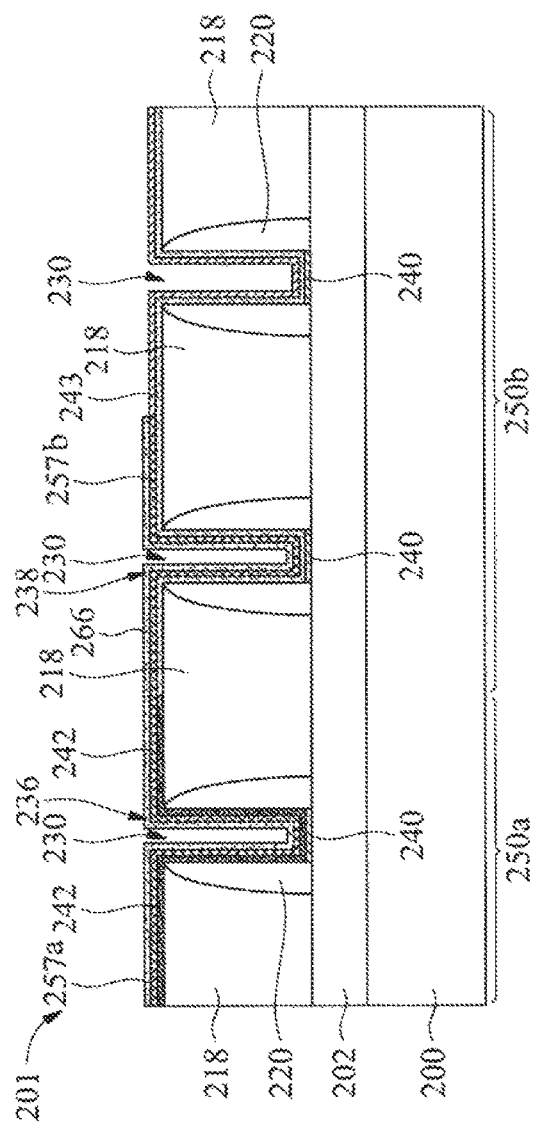
Figure 2L1

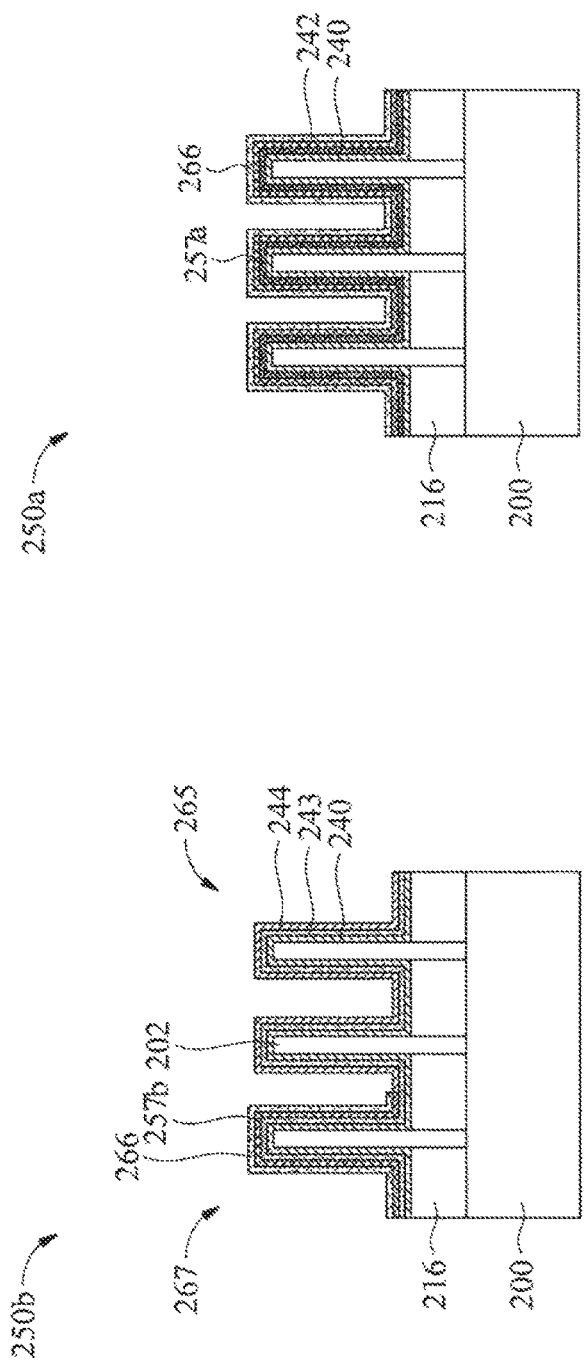
Figure 2L3
Figure 2L2

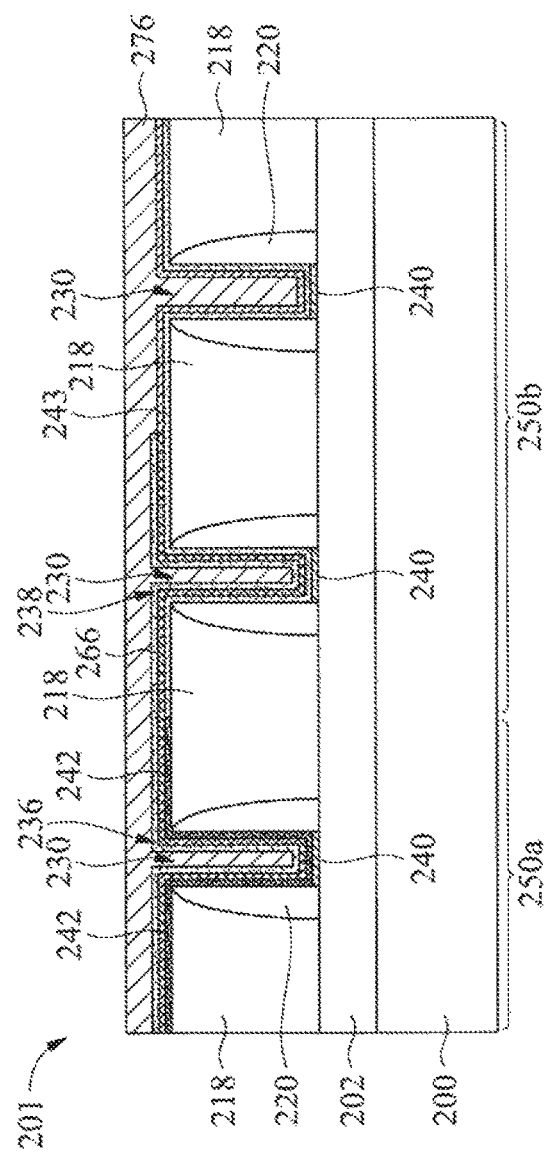
Figure 2M1

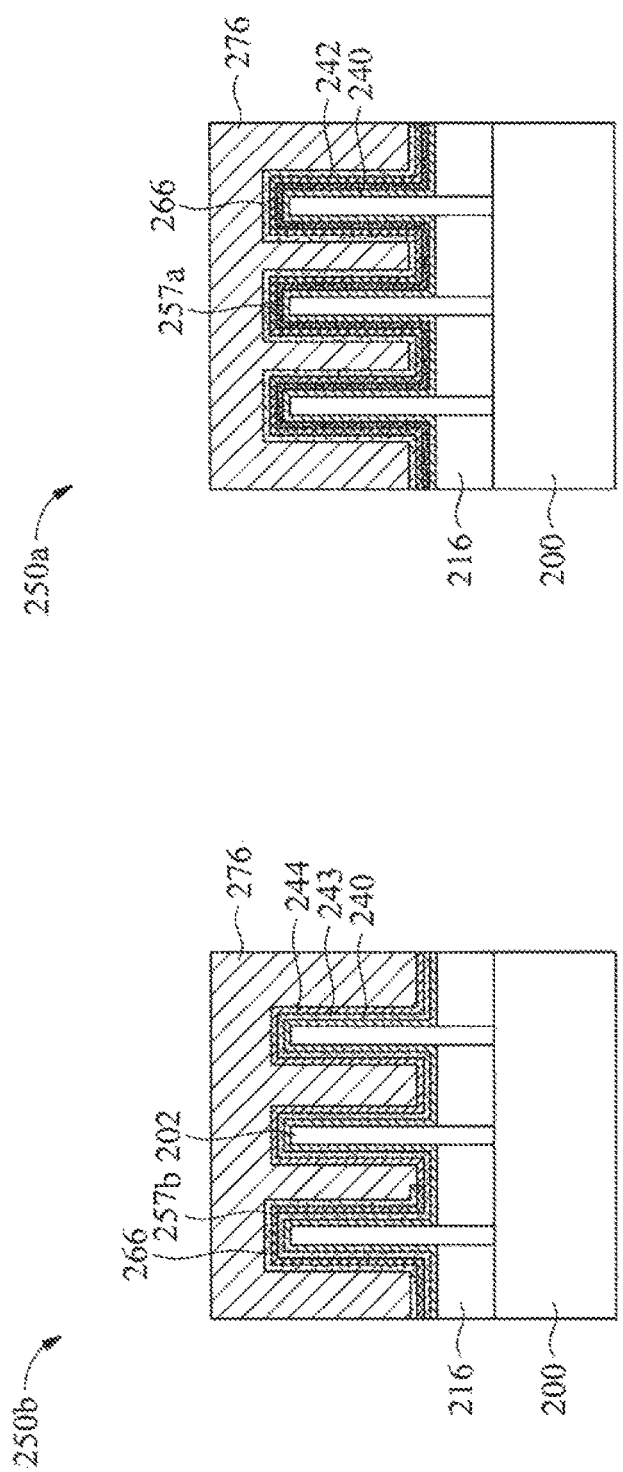
Figure 2M3
Figure 2M2

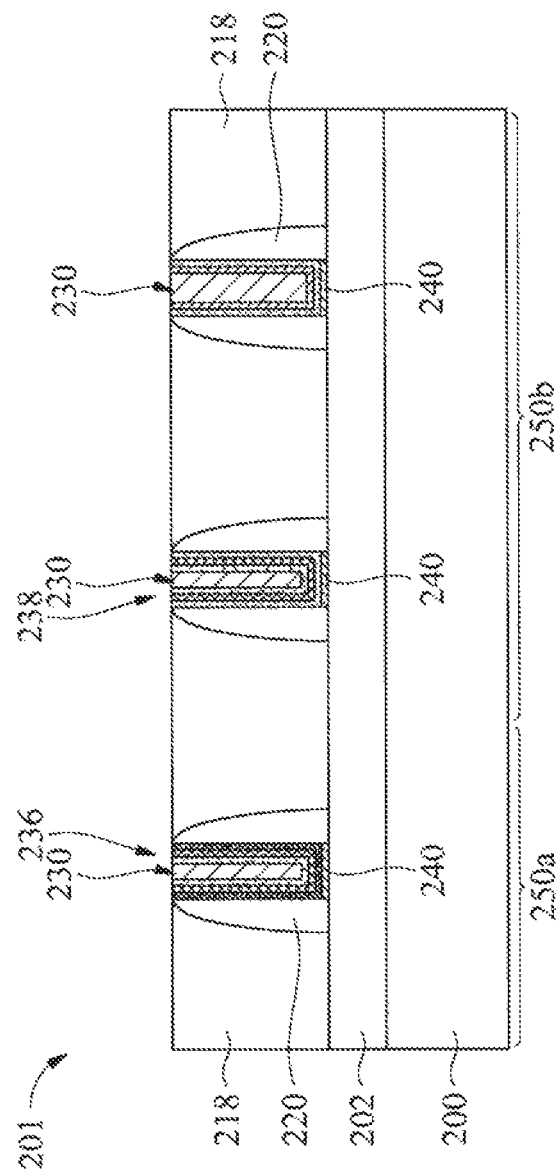
Figure 2N1

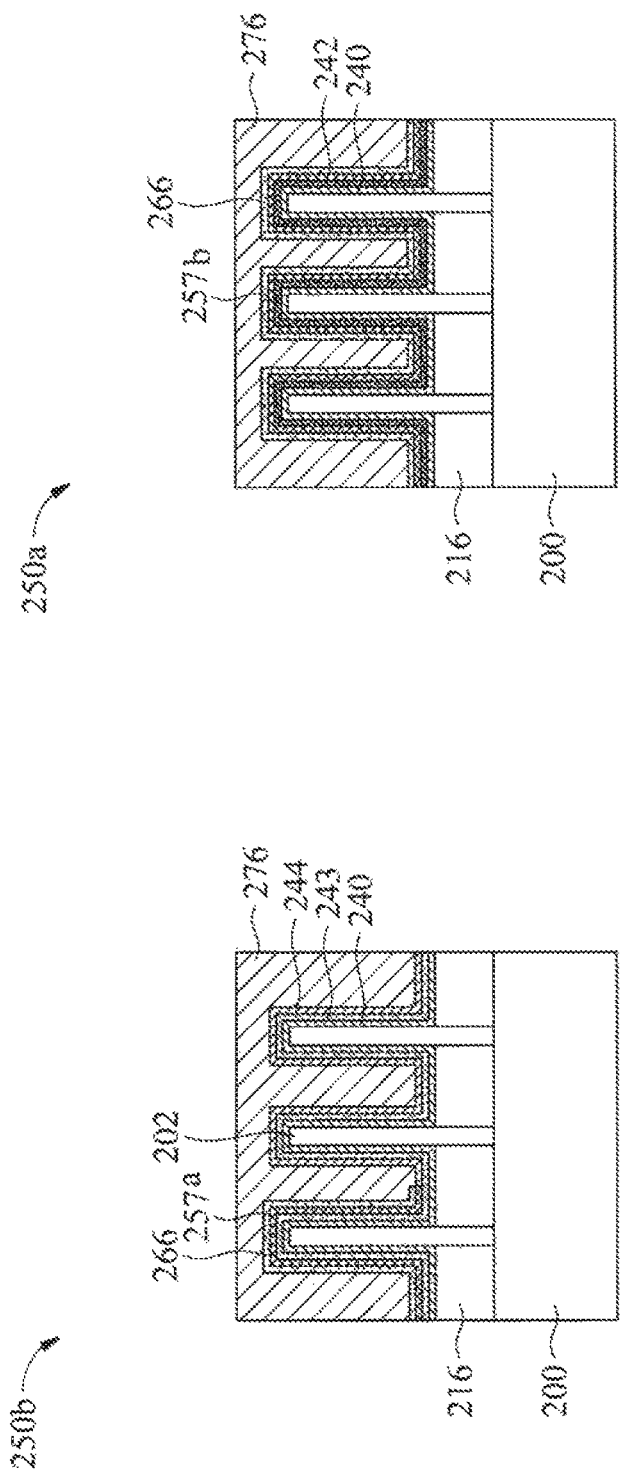
Figure 2N3
Figure 2N2

SELF-PROTECTIVE LAYER FORMED ON HIGH-K DIELECTRIC LAYERS WITH DIFFERENT MATERIALS

CROSS-REFERENCE TO RELATED APPLICATIONS

This application claims benefit of U.S. Provisional Application Ser. No. 62/527,806 filed Jun. 30, 2017, which is incorporated herein by reference in its entirety.

BACKGROUND

As the semiconductor industry has progressed into nanometer technology process nodes in pursuit of higher device density, higher performance, and lower costs, challenges from both fabrication and design have resulted in the development of three dimensional designs, such as fin field effect transistors (FinFETs). A typical FinFET is fabricated with a fin structure extending from a substrate, for example, by etching into a silicon layer of the substrate. The channel of the FinFET is formed in the vertical fin. A gate structure is provided over (e.g., overlying to wrap) the fin structure. It is beneficial to have a gate structure on the channel allowing gate control of the channel around the gate structure. FinFET devices provide numerous advantages, including reduced short channel effects and increased current flow.

As the device dimensions continue scaling down, FinFET device performance can be improved by using a metal gate electrode instead of a typical polysilicon gate electrode. One process of forming a metal gate stack is forming a replacement-gate process (also called as a "gate-last" process) in which the final gate stack is fabricated "last". However, there are challenges to implement such IC fabrication processes in advanced process nodes with complex surface topology and different surface materials. Inaccurate and improper control of the deposition and patterning process during the gate fabrication may adversely deteriorate electrical performance of the device structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 2B, and 2C1 depict perspective views of a semiconductor device structure at different manufacturing stages of FIG. 1 in accordance with some embodiments;

FIGS. 2C2-2C4 depict cross-sectional views of the semiconductor device structure at different manufacturing stages of FIG. 1 in accordance with some embodiments;

FIGS. 2D1-2D3, 2E1-2E3, 2F1-2F3, 2G1-2G3, 2H1-2H3, 2I1-2I3, 2J1-2J3, 2K1-2K3, 2L1-2L3, 2M1-2M3 and 2N1-2N3 depict cross-sectional views of the semiconductor device structure at different manufacturing stages of FIG. 1 in accordance with some embodiments.

DETAILED DESCRIPTION

Figure 1:
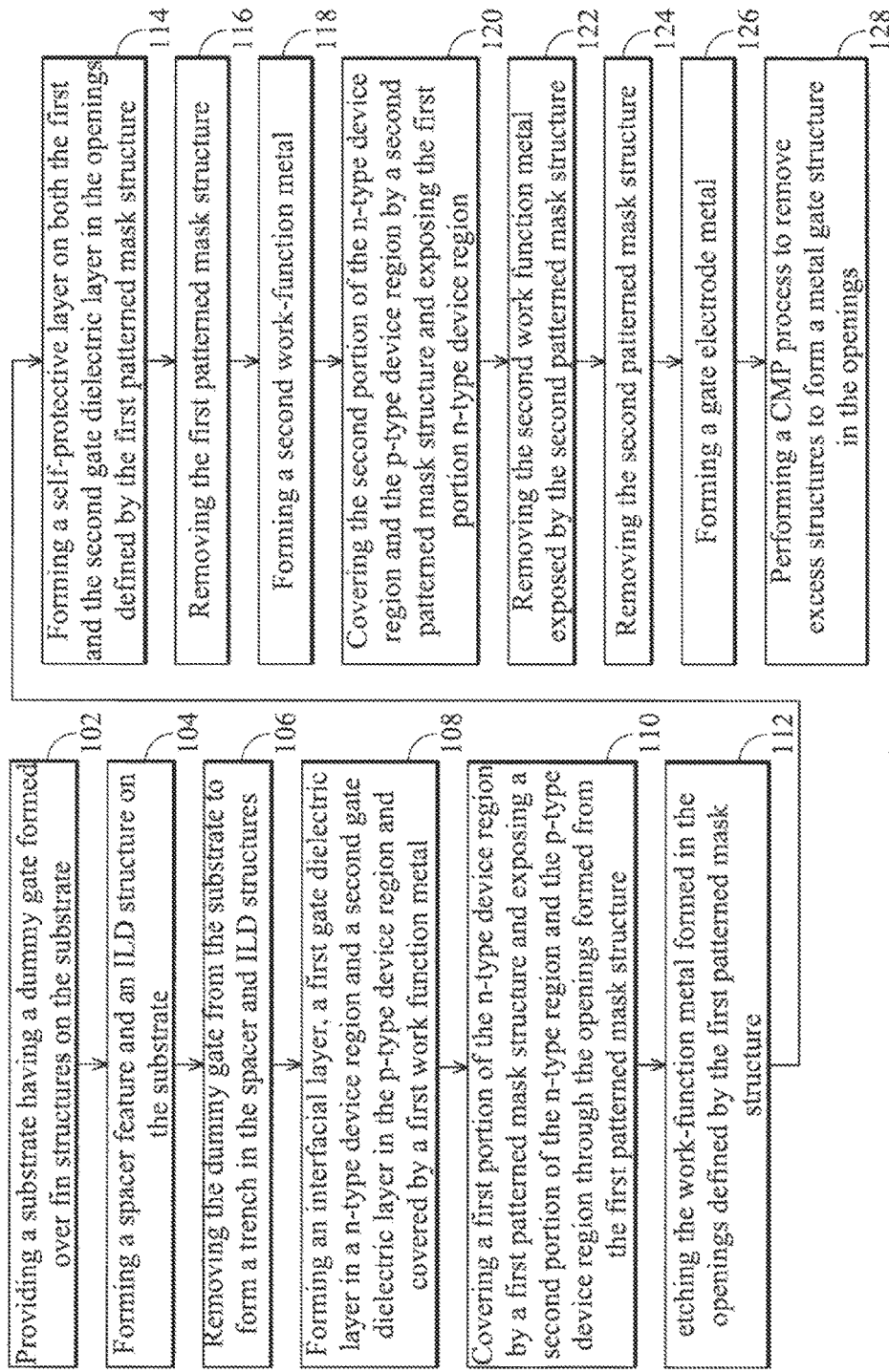
FIG. 1 is a flow chart of an exemplary process for manufacturing a device structure on a substrate in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to replacement gates formed in semiconductor devices. The present disclosure provides methods for and structures of protective layer(s) that protect a gate dielectric layer formed in the gate structures in a replacement gate manufacturing processes. Some examples described herein are in the context of FinFETs. In other implementations, replacement gates and processes in accordance with some embodiments may be implemented in vertical, gate all around (VGAA) devices, horizontal, gate all around (HGAA) devices, or other devices. Further, embodiments may be implemented in any advanced technology nodes.

In a replacement gate process for forming a metal gate for a transistor, a dummy gate stack is formed over a substrate as a placeholder for an actual gate stack later formed thereon. A spacer structure is formed surrounding the dummy gate stack. After source/drain features and an interlayer dielectric (ILD) are formed adjacent to the spacer structure, the dummy gate stack is removed, leaving an opening surrounded by the spacer structure and ILD. Then, a metal gate is formed in the opening defined by the spacer structure and ILD.

The metal gate structure includes a gate dielectric layer such as a high-k dielectric layer, an optional barrier layer, a layer, and a gate metal electrode. Multiple deposition and patterning processes may be used to form the layer, for example, to fine tune threshold voltage (Vt) of the transistor. In some embodiments, the layer may utilize different materials for different types of transistors, such as p-type FinFET or n-type FinFET, so as to enhance device electrical performance as needed. The barrier layer is optionally used to protect the gate dielectric layer during the patterning processes. However, the gate dielectric layer and the optional barrier layer may be inadvertently etched by some cleaning and/or etching processes. As a result, the gate dielectric layer and the optional barrier layer may lose its effectiveness and functions in the metal gate structure. Embodiments of the present disclosure may address such an issue.

Figure 2A:
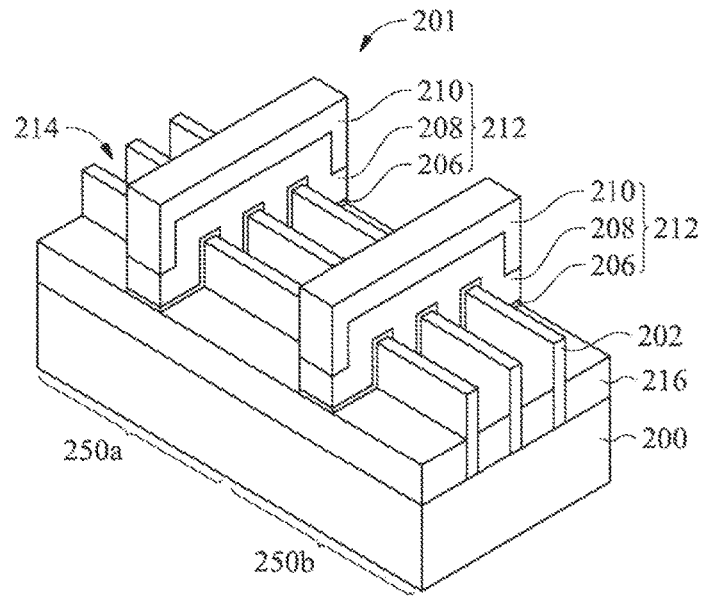

FIG. 1 depicts an exemplary flow diagram of a process 100 performed to form a semiconductor device structure, such as the device structure 201 depicted in FIGS. 2A-2L3. FIGS. 2A-2C1 are perspective views and FIGS. 2C2-2O are schematic cross-sectional views of a portion of the substrate corresponding to various stages of the process 100 in accordance with some embodiments. It is noted that the process 100 may be utilized to form any suitable structures, including the semiconductor device structure 201 depicted in FIGS. 2A-2L3 or other semiconductor structures not presented herein.

The process 100 begins at operation 102 by providing the substrate 200 having a dummy gate formed over a plurality of fin structures 202 formed on the substrate 200, as shown in FIG. 2A.

The substrate 200 can be or include a bulk semiconductor substrate, a semiconductor-on-insulator (SOI) substrate, or another substrate. The semiconductor material of the substrate 200 can include or be a material selected from at least one of silicon (e.g., crystalline silicon like Si<100> or Si<111>), silicon germanium, germanium, gallium arsenide, or another semiconductor material. The semiconductor material may be doped or undoped, such as with a p-type or an n-type dopant. In some embodiments wherein a SOI structure is utilized for the substrate 200, the substrate 200 may include semiconductor material disposed on an insulator layer, which may be a buried insulator disposed in a semiconductor substrate, or which may be a glass or sapphire substrate. In embodiments depicted herein, the substrate 200 is a silicon containing material, such as a crystalline silicon substrate. Moreover, the substrate 200 is not limited to any particular size, shape, or materials. The substrate 200 may be a round/circular substrate having a 200 mm diameter, a 300 mm diameter, or other diameters, such as 450 mm, among others. The substrate 200 may also be any polygonal, square, rectangular, curved, or otherwise non-circular workpiece, such as a polygonal substrate as needed.

Each fin structure 202 provides an active region where one or more devices are formed. The fin structures 202 are fabricated using suitable processes including masking, photolithography, and/or etch processes. In an example, a mask layer is formed overlying the substrate 200. The photolithography process includes forming a photoresist layer (resist) overlying the mask layer, exposing the photoresist layer to a pattern, performing a post-exposure bake process, and developing the photoresist layer to pattern the photoresist layer. The pattern of the photoresist layer is transferred to the mask layer using a suitable etch process to form a masking element. The masking element may then be used to protect regions of the substrate 200 while an etch process forms recesses 214 into the substrate, leaving an extending fin, such as the fin structures 202. The recesses 214 may be etched using reactive ion etch (RIE) and/or other suitable processes. Numerous other embodiments of methods to form a fin structure on a substrate may be utilized.

In an embodiment, the fin structures 202 are approximately 10 nanometer (nm) wide and in a range from approximately 10 nm to 60 nm in height, such as about 50 nm high. However, it should be understood that other dimensions may be used for the fin structures 202. In one example, the fin structures 202 comprise silicon materials or another elementary semiconductor, such as germanium, or a compound semiconductor including silicon carbide, gallium arsenic, gallium phosphide, indium phosphide, indium arsenide, and/or indium antimonide. The fin structures 202 may also be an alloy semiconductor including SiGe, GaAsP, AlInAs, AlGaAs, GaInAs, GaInP, GaInAsP, or a combination thereof. Further, the fin structures 202 may be doped using n-type and/or p-type dopants as needed.

As described, in an example, the plurality of fin structures 202 may be formed by etching a portion of the substrate 200 away to form recesses 214 in the substrate 200. The recesses 214 may then be filled with isolating material that is recessed or etched back to form isolation structures 216. Other fabrication techniques for the isolation structures 216 and/or the fin structure 202 are possible. The isolation structures 216 may isolate some regions of the substrate 200, e.g., active areas in the fin structures 202. In an example, the isolation structures 216 may be shallow trench isolation (STI) structures and/or other suitable isolation structures. The STI structures may be formed of silicon oxide, silicon nitride, silicon oxynitride, fluoride-doped silicate glass (FSG), a low-k dielectric material, and/or other suitable insulating material. The STI structures may include a multi-layer structure, for example, having one or more liner layers.

A dummy gate structure 212 is formed over the fin structures 202. In the example depicted in FIG. 2A, the dummy gate structure 212 includes a gate dielectric layer 206, a dummy gate layer 208, and a hardmask layer 210. It is noted that the dummy gate structure 212 may further include a capping layer and/or other suitable layers. The various layers in the dummy gate structure 212 may be formed by suitable deposition techniques and patterned by suitable photolithography and etching techniques. The dummy gate structure 212 engages the fin structures 202 on two or three sides of the fin structure 202. The term, "dummy", as described here, refers to a sacrificial structure which will be removed in a later stage and will be replaced with another structure, such as a high-k dielectric and metal gate structure in a replacement gate process. The replacement gate process refers to manufacturing a gate structure at a later stage of the overall gate manufacturing process. The gate dielectric layer 206 can be a dielectric oxide layer. For example, the dielectric oxide layer may be formed by chemical oxidation, thermal oxidation, atomic layer deposition (ALD), chemical vapor deposition (CVD), and/or other suitable methods. The dummy gate layer 208 may be a poly-silicon layer or other suitable layers. For example, the dummy gate layer 208 may be formed by suitable deposition processes such as low-pressure chemical vapor deposition (LPCVD) and plasma-enhanced CVD (PECVD). The hardmask layer 210 may be any material suitable to pattern the dummy gate structure 212 with desired features/dimensions on the substrate.

In an embodiment, the various layers of the dummy gate structure 212 are first deposited as blanket layers. Then, the blanket layers are patterned through a process including photolithography and etching processes, removing portions of the blanket layers and keeping the remaining portions over the isolation structures 216 and the fin structures 202 to form the dummy gate structure 212.

Figure 2B:
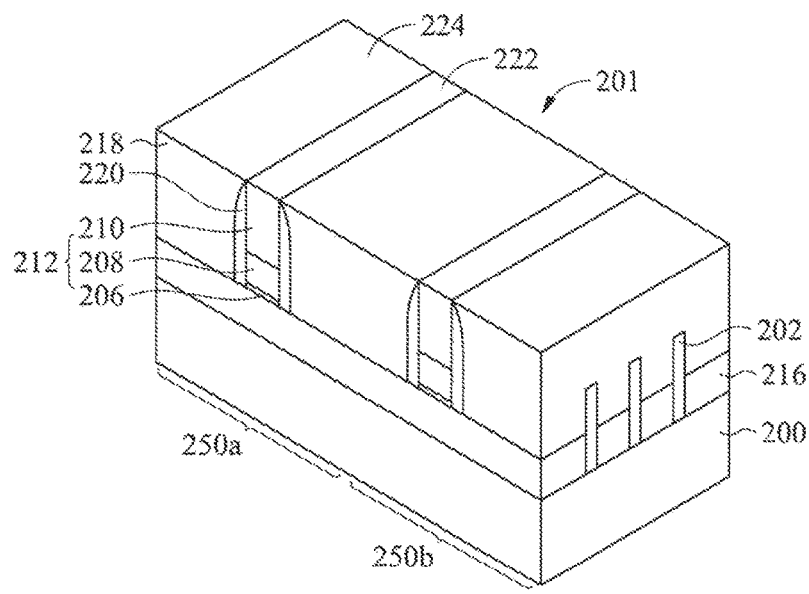

In an example, the semiconductor device structure 201 includes a p-type device region 250a and an n-type device region 250b. One or more p-type devices, such as p-type FinFETs, may be formed in the p-type device region 250a, and one or more n-type devices, such as n-type FinFETs, may be formed in the n-type device region 250b. The semiconductor device structure 201 may be included in an IC such as a microprocessor, memory device, and/or other IC At operation 104, a spacer feature 220 is formed on sidewalls of the dummy gate structure 212 and an interlayer dielectric (ILD) 218 is then formed on the spacer feature 220, as shown in FIG. 2B. The spacer feature 220 includes a material different from the material(s) for the dummy gate structure 212. In an embodiment, the spacer feature 220 includes a dielectric material, such as silicon nitride or silicon oxynitride. In an example, the spacer feature 220 may be a single layer or multiple layers. In an embodiment, after the dummy gate structure 212 is formed, one or more spacer layers are formed by conformally depositing spacer materials over the device structure 201. Subsequently, an anisotropic etching process is performed to remove portions of the spacer layers to form the spacer feature 220, as depicted in FIG. 2B.

After the spacer feature 220 is formed, one or more epitaxial growth processes may be performed to grow epitaxy source/drain regions (not shown). The epitaxial growth process may in-situ dope the epitaxy source/drain regions with a p-type dopant for forming a p-type device region 250a or an n-type dopant for forming an n-type device region 250b.

Subsequently, the ILD 218 is formed over the substrate 200 and on the spacer feature 220. In some embodiments, the device structure 201 may further include a contact etch stop layer (not shown) underneath the ILD 218 and above the substrate 200 and spacer feature 220. The ILD 218 may include materials such as tetraethylorthosilicate (TEOS) oxide, un-doped silicate glass, doped silicon oxide such as borophosphosilicate glass (BPSG), fused silica glass (FSG), phosphosilicate glass (PSG), boron doped silicon glass (BSG), and/or other suitable dielectric materials. The ILD 218 may be deposited by a PECVD process, HDP-CVD process, or other suitable deposition technique. In an embodiment, the ILD 218 is formed by a CVD process to fill the recesses 214 and to fill between neighboring dummy gate structures 212. After various deposition processes, a chemical mechanical planarization (CMP) process is performed to planarize the ILD 218, defining a top surface 224 that is substantially coplanar with a top surface 222 of the dummy gate structure 212 exposed on the substrate 200 for subsequent fabrication steps, as shown in FIG. 2B.

At operation 106, the dummy gate structure 212 is removed from the substrate 200 to define an opening 230 in the ILD 218, as shown in FIG. 2C1. In the embodiment shown in FIG. 2C1, the opening 230 exposes a surface 232 of the isolation structures 216. FIG. 2C2 depicts a cross-sectional view cutting along the line A-A' including the openings 230 defined in the ILD 218 for ease of description of the device manufacturing process. FIG. 2C3 depicts a cross-sectional view cutting along the line B-B' including the opening 230 exposing the fin structures 202 and the isolation structures 216 in the n-type device region 250b. FIG. 2C4 depicts a cross-sectional view cutting along the line C-C' including the opening 230 exposing the fin structures 202 and the isolation structures 216 in the p-type device region 250a. The opening 230 allows a gate structure, such as a metal gate structure, to be formed therein.

The dummy gate structure 212 may be removed using etching processes. The etching processes may include a suitable wet etch, dry (plasma) etch, and/or other processes. For example, a dry etching process may use chlorine-containing gases, fluorine-containing gases, other etching gases, or a combination thereof. The wet etching solutions may include $NH_4OH$, HF (hydrofluoric acid) or diluted HF, deionized water, TMAH (tetramethylammonium hydroxide), other suitable wet etching solutions, or combinations thereof.

At operation 108, an interfacial layer 240, a gate dielectric layer 242, 243 and a first work function tuning layer 244 are sequentially formed in the openings 230 defined by the spacer feature 220 in the p-type and n-type device region 250a, 250b respectively, as shown in FIG. 2D1-2D3. Similarly, FIG. 2D1 depicts a cross-sectional view cutting along the line A-A' including the openings 230 defined in the ILD 218 for ease of description of the device manufacturing process. FIG. 2D2 depicts a cross-sectional view cutting along the line B-B' including the opening 230 exposing the fin structures 202 and the isolation structures 216 in the n-type device region 250b. FIG. 2D3 depicts a cross-sectional view cutting along the line C-C' including the opening 230 exposing the fin structures 202 and the isolation structures 216 in the p-type device region 250a.

In an example, the interfacial layer 240 may include a dielectric material such as silicon oxide layer ($SiO_2$) or silicon oxynitride (SiON) and the like. The interfacial layer 240 may be formed by chemical oxidation, thermal oxidation, atomic layer deposition (ALD), CVD, and/or other suitable dielectric. Although the interfacial layer 240 as depicted in FIGS. 2D1-2D3 is formed between the fin structure 202 and the gate dielectric layer 242, 243, it is noted that the interfacial layer 240 may be formed along sidewall of the openings 230 in contact with and between the spacer feature 220 and the gate dielectric layer 242, 243.

In this particular example depicted in FIGS. 2D1-2D3, the gate dielectric layer 242 in the p-type device region 250a may be fabricated from different materials from that of the gate dielectric layer 243 in the n-type device region 250b. The gate dielectric layers 242, 243 can include a high-k dielectric constant material such as hafnium oxide ($HfO_2$), $Al_2O_3$, lanthanide oxide ($LaO_2$), $TiO_2$, HfZrO, $Ta_2O_3$, $HfSiO_4$, $ZrO_2$, $ZrSiO_2$, combinations thereof, or other suitable material. The gate dielectric layers 242, 243 may be formed by ALD and/or other suitable methods. For example, the gate dielectric layer 242 may be conformally deposited in the device regions 250a and 250b, and using photolithography, masking, and etching, the gate dielectric layer 242 can be removed from the n-type device region 250b. Then, the gate dielectric layer 243 may be conformally deposited in the device regions 250a and 250b, and using photolithography, masking, and etching, the gate dielectric layer 243 can be removed from the p-type device region 250a. It is noted that the gate dielectric layer 242 may be directly formed on the substrate 200 (e.g., on the fin structure 202) when the interfacial layer 240 is not present.

In one example, the gate dielectric layer 242 as depicted in FIG. 2D3 located in the p-type device region 250a may be a Ta containing material, such as TaN, TaON, TaO, HfN, ZrN and the like. The gate dielectric layer 243 as depicted in FIG. 2D2 located in the n-type device region 250b may be a Si containing material, such as TaSiN, TiSiN, WSiN, HfSiN, ZrSiN and the like. It is noted that different gate dielectric layer materials formed at different locations, such as the p-type device region 250a or the n-type device region 250b, may provide different material properties that may achieve different device electrical performance as needed. In one specific example, the gate dielectric layers 242, 243 are respectively a TaN layer and a TiSiN layer or vice versa.

After the gate dielectric layers 242, 243 are formed, the first work function tuning layer 244 is formed on the gate dielectric layers 242, 243. The first work function tuning layer 244 is formed for tuning the work function of the device. The first work function tuning layer 244 may be a p-type work function material for p-type FinFET devices in the p-type device region 250a or an n-type work function material for n-type FinFET devices in the n-type device region 250b. Suitable examples of the p-type work function material, which may have a work function ranging between 4.8 eV and 5.2 eV, includes TiN, TaN, Ru, Mo, Al, WN, $ZrSi_2$, $MoSi_2$, $TaSi_2$, $NiSi_2$, WN, other suitable p-type layer materials, or combinations thereof, and suitable examples of the n-type work function material, which may have a work function ranging between 3.9 eV and 4.3 eV, includes Ti, Ag, TaAl, TaAlC, HfAl, TiAl, TiAlN, TaC, TaCN, TaSiN, Mn, Zr, other suitable n-type layer materials, or combinations thereof.

A work function value is associated with the material composition of the first work function tuning layer 244. The material of the first work function tuning layer 244 is chosen to tune its work function value so that a desired threshold voltage (Vt) is achieved in the device that is to be formed in the respective region. The first work function tuning layer 244 may provide uniform threshold voltage (Vt). The first work function tuning layer 244 may be deposited by CVD, ALD and/or other suitable process. In an example depicted herein, the first work function tuning layer 244 is formed using an ALD process.

The thickness of the first work function tuning layer 244 may be altered and adjusted by altering process parameters during the ALD deposition process, such as the number of cycles, number of the pulses of precursors, pulse frequency, substrate temperature, pressure, and the like. In one example, the thickness of the first work function tuning layer 244 is adjusted by altering the numbers of the deposition cycles of the ALD process for depositing the first work function tuning layer 244.

At operation 110, a first patterned mask structure 248 is disposed on the n-type device region 250b of the device structure 201 of the substrate 200, as shown in FIG. 2E1-2E3. The first patterned mask structure 248 covers a first portion 265 of the n-type device region 250b of the device structure 201, as shown in FIG. 2E2, and exposes the p-type device region 250a and a second portion 267 of the n-type device region 250b of the device structure 201 for further etching, as shown in FIGS. 2E2 and 2E3. This example may be applied to the situation when different types of the layers are desired to be formed at different locations of the gate dielectric layers comprising different materials. Thus, when removing a portion of the layers from the substrate, different gate dielectric layers comprising different materials may be exposed, which may challenge the etching stop point during the layer removal process. Thus, a well selected etching/patterning process is performed to provide good interface control when removing the layers from the substrate at certain locations of the substrate.

The first patterned mask structure 248 serves as a mask during an etching/patterning process so as to protect the structure covered by the first patterned mask structure 248 from damage during the etching/patterning process. The first patterned mask structure 248 may include a photoresist 254 disposed on a bottom anti-reflective coating (BARC) 252. The photoresist 254 may be patterned by a photolithography process to have a desired dimension that may be utilized as a mask to transfer features onto the substrate 200. The BARC 252 may be an organic material coated onto the substrate 200 filling the openings 230 in the device regions 250a and 250b, and a portion of the BARC 252 may be removed, such as by an etching process after the photoresist 254 is patterned, such that the BARC 252 remains in the n-type device region 250b as depicted in FIGS. 2E1 and 2E2. Although the example depicted in FIGS. 2E1 and 2E2 shows that the first patterned mask structure 248 is formed in the opening 230 defined on the n-type device region 250b, it is noted that the first patterned mask structure 248 may be formed at another portion of the substrate, such as the p-type device region 250a as needed.

At operation 112, an etching process is performed to remove the first work function tuning layer 244 from the openings 230 in the p-type device region 250a and the second portion 267 of the n-type device region 250b, as shown in FIG. 2F1-2F3, of the substrate 200 defined by the first patterned mask structure 248. The etching process may be a wet etching process performed by immersing or soaking the substrate 200 with an etching solution. In another example, a dry process, such as a vapor or a plasma process, is utilized to remove the first work function tuning layer 244 in the p-type device region 250a and some locations of the n-type device region 250b. In yet another example, a combination of wet and dry processes is utilized to remove the first work function tuning layer 244 from the desired locations. In a specific example, removing the first work function tuning layer 244 from the openings 230 at operation 112 is a wet process performed by dipping, immersing, or soaking the substrate with or in an etching solution in a wet tank. The etching solution may be an alkaline, neutral or acid solution with a pH value in a predetermined range. Selection of the etching solution is based on the material types of the first work function tuning layer 244 to be removed from the substrate 200.

In an embodiment, the etching solution includes phosphoric acid ($H_3PO_4$ or orthophosphoric acid) and boric acid ($H_3BO_3$) in an aqueous solution (e.g., $H_2O$). To further this embodiment, the etching solution may include a mixture of phosphoric acid and boric acid with other components such as hydrogen peroxide ($H_2O_2$). In an example, the ratio of phosphoric acid in the DI water of the etching solution is in a range from about 1% to about 10% by volume. The ratio of boric acid in the DI water of the etching solution is less than 10 percent by volume, such as in a range from about 1% to about 5% by volume. The ratio of hydrogen peroxide ($H_2O_2$) in the DI water of the etching solution is less than 20 percent by volume, such as in a range from about 1% to about 5% by volume. Alternatively, the ratio between the phosphoric acid and the boric acid in the etching solution may be controlled in a range from about 1:5 to about 5:1, such as about 2:1, by volume. In one specific example, the etching solution includes phosphoric acid, boric acid, and hydrogen peroxide ($H_2O_2$).

In an example, the etching solution is an acid solution that reacts with the materials from the first work function tuning layer 244. The acid solution etches the first work function tuning layer 244, e.g., a metal containing material. Other acid etchants, such as hydrofluoric acid (HF), hydrochloric acid (HCl), and/or sulfuric acid ($H_2SO_4$), may be added to provide different pH levels for a given concentration.

In another example, the etching solution is an alkaline solution that reacts with the materials from the first work function tuning layer 244. The alkaline solution etches the first work function tuning layer 244, e.g., a metal containing material. Other alkali etchants, such as $NH_4OH$, may be added to provide different pH levels for a given concentration. These etchants may be utilized to maintain a desired level of pH value and/or to assist dissociation of the chemical compounds dissolved in the etching solution. The pH value of the etching solution can be controlled in a range from about 2 to about 12 as needed. In an example, the etching process may be maintained at a temperature in a range from about 20 to about 80 degrees Celsius.

At operation 114, upon the removal of the first work function tuning layer 244 in the p-type device region 250a and the second portion 267 of the n-type device region 250b, a self-protective layer 257a, 257b is formed on the gate dielectric layer 242, 243 when the etching solution encounters a surface of the gate dielectric layer 242, 243, as shown in FIG. 2G1-2G3. The self-protective layer 257a, 257b are formed on the surfaces 255, 256 (including surfaces of bottom portions and sidewall portions) of the gate dielectric layers 242, 243 as a result of phosphoric and boric acid chelating. The etching solution is particularly selected to react with the certain elements from the gate dielectric layers 242, 243 so as to form the desired self-protective layers 257a, 257b on the corresponding surfaces 255, 256. The phosphorus (P) element from the phosphoric acid tends to react with the metal elements, such as Ta, Hf, Zr, and the like, from the high dielectric constant material selected for the gate dielectric layer 242, forming metal phosphate, such as metal containing phosphoric acid chelating or metal containing complexing agents, on a first region 236 (e.g., a region where the etching solution encounters the surface 255 of the gate dielectric layer 242) of the self-protective layer 257a so as to protect the surface 255 of the gate dielectric layer 242 from being further etched.

In the meantime, the boron (B) element from the boric acid tends to react with the silicon elements, such as TaSiN, TiSiN, WSiN, HfSiN, ZrSiN and the like, from the high dielectric constant material selected for the gate dielectric layer 243, forming a silicon and/or boron comprising complex agents, such as silicon-boronate complex agents, on a second region 238 (e.g., a region where the etching solution encounters the surface 256 of the gate dielectric layer 243) of the self-protective layer 257b so as to protect the surface 256 of the gate dielectric layer 243 from being further etched.

The self-protective layer 257b, 257a include the silicon-boronate complex agents and the metal phosphate, such as metal containing phosphoric acid chelating or metal containing complexing agents so as to protect the surfaces 256, 255 of the gate dielectric layers 243, 242 from being further etched, depending on where the self-protective layer 257b, 257a are formed from. When the surfaces 255, 256 of the gate dielectric layers 242, 243 are exposed, the metal and silicon elements embedded in the gate dielectric layers 242, 243 are also simultaneously exposed, triggering the chemical reaction between the metal and silicon elements embedded in the gate dielectric layers 242, 243 and the etching solution. The phosphorus elements from the phosphoric acid and the boron elements from the boric acid from the etching solution react with the gate dielectric layers 242, 243, respectively, to form the metal phosphate dominantly on the first region 236 of the self-protective layer 257a and the silicon-boronate complex agents dominantly on the second region 238 of the self-protective layer 257b. Some of the metal elements from the metal phosphate and the silicon elements from the silicon-boronate complex agents are sourced from the surfaces 255, 256 of gate dielectric layers 242, 243, respectively, while some of the metal and silicon elements are formed as the self-protective layer 257a, 257b. Thus, the metal phosphate and the silicon-boronate complex agents bridge between the gate dielectric layers 242, 243 and the self-protective layers 257a, 257b. Although the metal phosphate may be dominantly formed in the first region 236 of the self-protective layer 257a due to the metal elements sourced from the surface 255 of the gate dielectric layer 242, it is noted that the metal phosphate may be found and detectable all across the self-protective layer 257a, if present. In contrast, although the silicon-boronate complex agents may be dominantly formed in the second region 238 of the self-protective layer 257b due to the silicon elements sourced from the surface 256 of the gate dielectric layer 243, it is noted that the silicon-boronate complex agents may be found and detectable all across the self-protective layer 257b, if present.

Figure 3A:
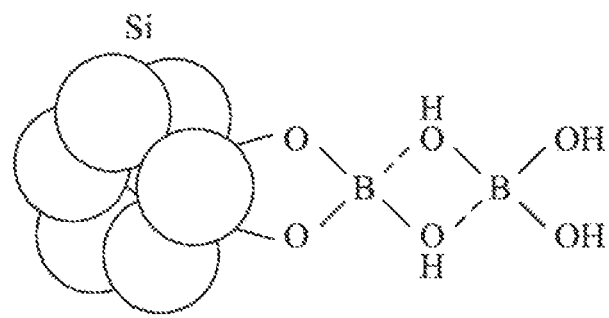
FIGS. 3A-3B depict different examples of surface structure reactions during the metal patterning processes depicted in FIG. 1 in accordance with some embodiments.

In one example, the gate dielectric layer 243 includes a silicon element, such as TaSiN, TiSiN, WSiN, HfSiN, ZrSiN and silicon containing dielectrics. The Si element reacts with the boric acid from the etching solution to form Si—B silicon-boronate complex agents, as shown in FIG. 3A.

Figure 3B:
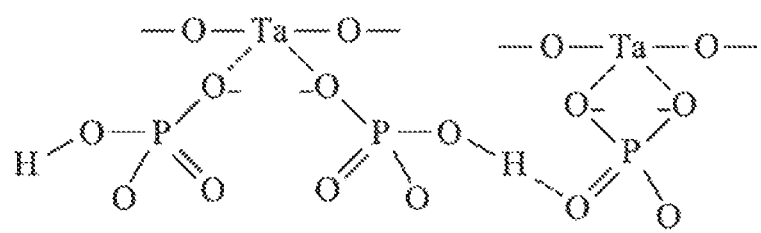

Similarly, the gate dielectric layer 242 includes a Ta element, such as TaN, TaON, TaO or the like. The phosphate head group may be coordinated onto the Ta element containing surface from the gate dielectric layer 242, forming mono-dentate and bi-dentate complexes to protect the gate dielectric layer 242, as shown in FIG. 3B. The phosphate metal linkage formed in the high dielectric constant material from the gate dielectric layer 242 provides good bonding at the interface, joining the self-protective layer 257a onto the gate dielectric layer 242. It is believed that the phosphate metal linkage may also be formed from Zr or Hf so that high-k material including these metal elements, such as HfN, ZrN and HfO$_2$, may also be utilized to form the self-protective layer 257a at the interface.

As shown in FIG. 2G1-2G3, as a result of the bonding of the gate dielectric layers 242, 243 with components from the etching solution, the self-protective layer 257a, 257b are formed on the gate dielectric layers 242, 243 when the surfaces 255, 256 (including surfaces of bottom portions and sidewall portions) of the gate dielectric layers 242, 243 are exposed. In turn, formation of the self-protective layers 257a, 257b cause the etching of the first work function tuning layer 244 in the openings 230 to automatically stop at the gate dielectric layers 242, 243. Because the metal and silicon elements from the self-protective layers 257a, 257b are sourced from the silicon and metal element from the gate dielectric layers 242, 243 respectively, the gate dielectric layers 242, 243 and the self-protective layers 257a, 257b have a common metal and/or silicon element formed therein. The common silicon element is from any suitable silicon containing materials selected to fabricate the gate dielectric layer 243. The common metal element may be Ta, Ti, Hf, Zr, or a combination thereof, or any suitable materials selected to fabricate the metal dielectric material for the gate dielectric layer 242.

After the self-protective layer 257a, 257b are formed, the substrate 200 may be removed from the etching solution. A rinse process may be performed to remove etching residues from the opening 230. For example, the rinse process may use a solution containing DI water, carbonized DI water, such as DI water with carbon dioxide, or DI water with NH$_4$OH. The rinse process may be performed at a temperature in a range from about 20 to about 80 degrees Celsius. Furthermore, a drying process may also be performed to dry the surface of the substrate 200. For example, the drying process may include a spin drying of the substrate 200 in the presence of a flow of nitrogen. For example, the drying process may include an isoprophyl alcohol (IPA) drying process.

In one example, the self-protective layers 257a, 257b have a thickness in a range from 10 Å to 20 Å.

At operation 116, after the self-protective layer 257a, 257b are formed in the p-type device region 250a and the second portion 267 of the n-type device region 250b, the first patterned mask structure 248 is removed, as shown in FIGS. 2H1-2H3. After the first patterned mask structure 248 is removed, the first work function tuning layer 244 is exposed in the first portion 265 of the n-type device region 250b as well as the self-protective layers 257a, 257b formed in the p-type device region 250a and the second portion 267 of the n-type device region 250b.

At operation 118, after the first patterned mask structure 248 is removed, a second work function tuning layer 266 is conformally formed on the self-protective layers 257a, 257b and the first work function tuning layer 244, as shown in FIG. 2I1-2I3. The material selected to fabricate the second work function tuning layer 266, which will remain in the p-type device region 250a and the second portion 267 of the n-type device region 250b after multiple patterning process, may be different from the first work function tuning layer 244 existing on the first portion 265 of n-type device region 250b of the substrate 200.

Although the example described here provides forming different types of the layer in the n-type device region 250b, it is noted that different types of the layer may be formed within the p-type device region 250a, or between both the n-type and p-type device regions 250b, 250a, or any suitable locations in the semiconductor device structure 201.

As discussed above, a work function value is associated with the material composition of the first work function tuning layer 244 and the second work function tuning layer 266. By utilizing different materials to fabricate the first and the second work function tuning layers 244, 266 in different device regions of the substrate 200 (e.g., within or between p-type and n-type device regions 250a and 250b), the work function value of the metal gate structures may be more flexibly adjusted and tuned as needed. Suitable examples of the p-type layer materials, which may have a work function ranging between 4.8 eV and 5.2 eV, include TiN, TaN, Ru, Mo, Al, WN, $ZrSi_2$, $MoSi_2$, $TaSi_2$, $NiSi_2$, WN, other suitable p-type materials, or combinations thereof, and suitable examples of the n-type materials, which may have a work function ranging between 3.9 eV and 4.3 eV, include Ti, Ag, TaAl, TaAlC, HfAl, TiAl, TiAlN, TaC, TaCN, TaSiN, Mn, Zr, other suitable n-type materials, or combinations thereof. The second work function tuning layer 266 may be deposited by CVD, ALD and/or other suitable process.

In an example depicted herein, the second work function tuning layer 266 is formed using an ALD process. The thickness of the second work function tuning layer 266 may be altered and adjusted by altering process parameters during the ALD deposition process, such as the numbers of the deposition cycles, number of the pulses of precursors, pulse frequency, substrate temperature, pressure, and the like. In one example, the thickness of the second work function tuning layer 266 is adjusted by altering the numbers of the deposition cycles of the ALD process for depositing the second work function tuning layer 266.

At operation 120, after the second work function tuning layer 266 is formed, a second patterned mask structure 291 is disposed on the p-type device region 250a and the second portion 267 of the n-type device region 250b and fills the opening 230 in the p-type device region 250a and the second portion 267 of the n-type device region 250b of the device structure 201 of the substrate 200, as shown in FIG. 2J1-2J3. The second patterned mask structure 291 covers the p-type device region 250a and the second portion 267 of the n-type device region 250b, and exposes the first portion 265 of the n-type device region 250b of the device structure 201 for further etching. The second patterned mask structure 291 serves as a mask during an etching/patterning process so as to protect the structure covered by the second patterned mask structure 291 from damage during the etching/patterning process.

Similar to the first patterned mask structure 248 described above, the second patterned mask structure 291 may include a photoresist 292 disposed on a bottom anti-reflective coating (BARC) 293. The photoresist 292 may be patterned by a photolithography process to have a desired dimension that may be utilized as a mask to transfer features onto the substrate 200. The BARC 293 may be an organic material coated onto the substrate 200 filling the openings 230 in the device regions 250a and 250b, and a portion of the BARC 293 may be removed, such as by an etching process after the photoresist 292 is patterned, such that the BARC 293 remains in the p-type device region 250a as depicted in FIG. 2J1-2J3. It is noted that the first patterned mask structure 248 and the second patterned mask structure 291 are formed at different stages of the process to etch layers at different regions of the substrate so as to form different film scheme at different regions of the substrate for different device performance requirement and adjustment.

At operation 122, an etching process is performed to remove the second work function tuning layer 266 from the first portion 265 of the n-type device region 250b, depicted in FIG. 2K1-2K3, of the substrate 200. The etching process may be a wet etching process performed by immersing or soaking the substrate 200 with an etching solution. In another example, a dry process, such as a vapor or a plasma process, is utilized to remove the second work function tuning layer 266 in the first portion 265 of the n-type device region 250b. In yet another example, a combination of wet and dry processes is utilized to remove the second work function tuning layer 266 in the n-type device region 250b as needed. In a specific example, removing the second work function tuning layer 266 at operation 122 is a wet process performed by dipping, immersing, or soaking the substrate with or in an etching solution in a wet tank. The etching solution may be an alkaline, neutral or acid solution with a pH value in a predetermined range. Selection of the etching solution is based on the material types of the second work function tuning layer 266 to be removed from the substrate 200.

At operation 124, after the second work function tuning layer 266 is removed, the second patterned mask structure 291 is then removed from the p-type device region 250a and the second portion 267 of the n-type device region 250b from the device structure 201, as shown in FIG. 2L1-2L3. After the second patterned mask structure 291 is removed, the second work function tuning layer 266 is exposed in the p-type device region 250a as well as the second portion 267 of in the n-type device region 250b while keeping the first work function tuning layer 244 formed in the first portion 265 of the n-type device region 250b.

Thus, the film scheme (e.g., the gate dielectric layer 242, the self-protective layer 257a, 257b and the second work function tuning layer 266) formed in the p-type device regions 250a is configured to be different from the film scheme (e.g., the gate dielectric layer 243, the self-protective layer 257 and the second or first work function tuning layer 266, 244) formed in the different locations of the n-type device region 250b of the substrate 200. In some locations, a third layer may be utilized as needed. By utilizing different film schemes, different materials for different structures in different regions, e.g., the p-type or different locations of the n-type device regions 250a, 250b or vice versa, of the device structure 201, the work function value or the other associated electrical performance of the metal gate structure formed in the device structure 201 may be flexibly and efficiently adjusted and enhanced.

Furthermore, by forming the self-protective layers 257a, 257b at the interface between the gate dielectric layer 242, 243 and the first and the second work function tuning layers 244, 266 (or even a third layer as needed), a good interface control as well as electrical performance enhancement and adjustment may be obtained and achieved.

At operation 126, after the second patterned mask structure 291 is removed from the substrate 200, a gate electrode metal 276 is filled in the openings 230 defined in the ILD 218 to complete the metal gate structure 280, as shown in FIG. 2M1-2M3. The gate electrode metal 276 may also be called a metal filling layer that is formed by CVD, PVD, plating, and/or other suitable processes. The gate electrode metal 276 may include Al, W, or Cu and/or other suitable materials. In one example, a liner layer (not shown), such as TiN, TaN, TiON, TaON and the like, may be formed on the substrate prior to forming the gate electrode metal 276.

At operation 128, a CMP process may be performed to remove excess materials from the metal gate structure 280 so as to planarize a top surface of the device structure 201, as shown in FIGS. 2N1-2N3.

Figure 4A:
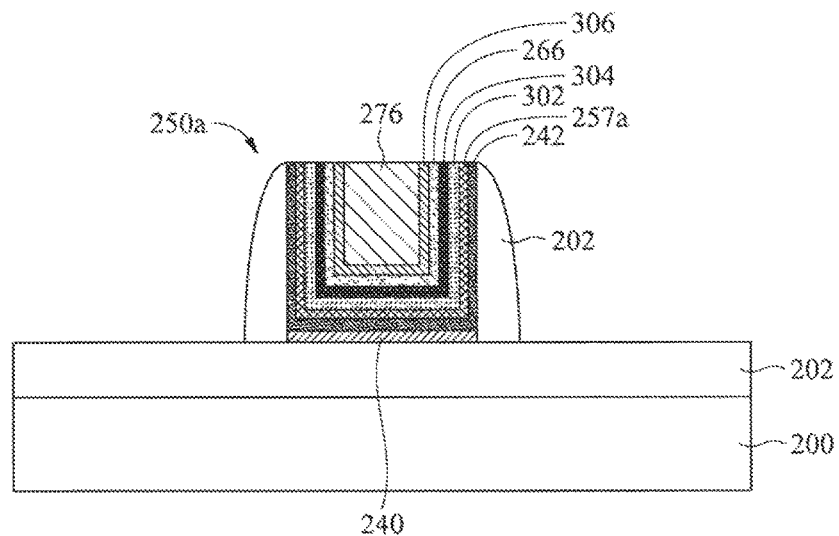
FIGS. 4A-4B depict an example of semiconductor device structure after the manufacturing process of FIG. 1.
Figure 4B:
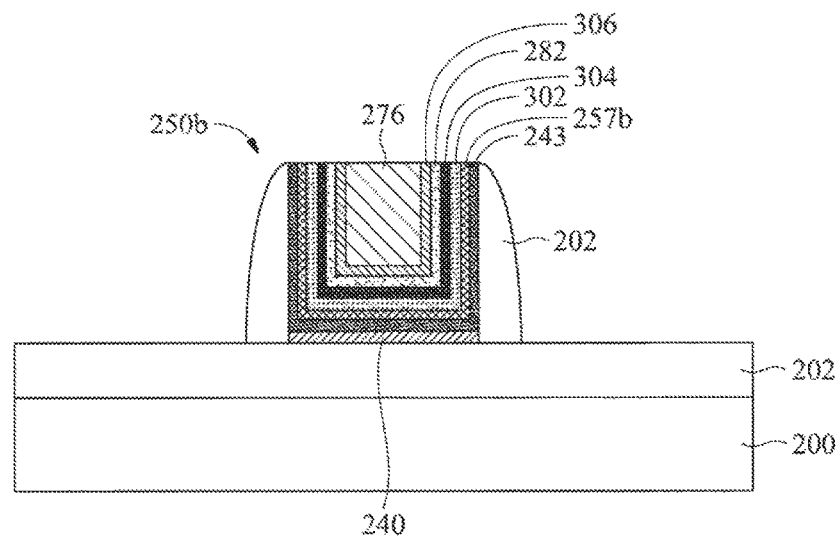

FIGS. 4A-4B depict yet another embodiments of the film scheme that may be formed In the p-type device regions 250a and the n-type device region 250b. In addition to the interfacial layer 240, the gate dielectric layers 242, 243, self-protective layers 257a, 257b, the work function tuning layer 266, and the gate electrode metal 276, additional or different layers may be used or replaced in the film scheme. For example, in the example depicted in FIG. 4A for the film scheme in the p-type device region 250a, a capping layer 302 is formed on the self-protective layer 257a and a barrier layer 304 is followed to be formed on the capping layer 302. After the barrier layer 304 is formed, the second work function tuning layer 266, as discussed above, may be formed on the barrier layer 304. Prior to forming the gate electrode metal 276, an adhesion layer 306 may be formed on the second work function tuning layer 266. The barrier and/or capping layers 304, 302 can include a nitride, silicon nitride, carbon nitride, and/or aluminum nitride of tantalum and/or titanium; a nitride, carbon nitride, and/or carbide of tungsten; the like; or a combination thereof. The second work function tuning layer 266 utilized here is a Ti, Al W containing alloys. The adhesion layer 306 may be optional and may be fabricated from a material similar to the capping layer 302.

In one particular example, the capping layer 302 is a TiN layer and the barrier layer is a TaN layer. The second work function tuning layer 266 utilized here is AlTiN or TiN. The optional adhesion layer 306 may be a TiN layer.

In another example depicted in FIG. 4B for the film scheme in the n-type device region 250b, similarly, the capping layer 302 and the barrier layer 304 are formed on the self-protective layer 257b. In the structure depicted in FIG. 4B, a third work function tuning layer 282, different from the first and the second work function tuning layers 244, 266, may be formed on the barrier layer 304. Subsequently, the adhesion layer 306 may be formed on the third work function tuning layer 282 followed by the gate electrode metal 276.

In one particular example, the capping layer 302 is a TiN layer and the barrier layer is a TaN layer. The second work function tuning layer 266 utilized here is AlTiN or TiN.

Although not intended to be limiting, one or more embodiments of the present disclosure provide many benefits to a semiconductor device and the formation thereof. For example, embodiments of the present disclosure provide methods for patterning layer layer(s) in a replacement gate process. According to the present disclosure, an etching solution including phosphoric acid (or orthophosphoric acid) and boric acid, along with hydrogen peroxide, in an etching solution can be utilized to pattern the layer with different types of materials of the gate dielectric materials disposed underneath the layer. Upon removal of the layer from the substrate and once the underlying gate dielectric layers are exposed, a self-protective layer can be formed simultaneously over the gate dielectric layers with different materials to terminate the patterning process. As a result, the self-protective layer may retain its blocking and bridging capability so as to form film structures with different variations at different locations of the devices to enhance the electrical performance. The patterning process utilizing the etchant comprising both phosphoric acid and boric acid to etch gate dielectric layers comprising different materials at different locations may be performed in any existing wet etching tool.

In embodiment, a semiconductor device includes a first gate structure and a second gate structure on a substrate; wherein the first gate structure includes a first gate dielectric layer having a first material, and the second gate structure includes a second gate dielectric layer having a second material, the first material being different from the second material, wherein the first and the second gate structures further comprises a first and a second self-protective layers disposed on the first and the second gate dielectric layers respectively, wherein the first self-protective layer comprises metal phosphate and the second self-protective layer comprises boron comprising complex agents and a first work function tuning layer on the first self-protective layer in the first gate structure. In an embodiment, the second gate structure further comprises a second work function tuning layer on the second self-protective layer in the second gate structure. In an embodiment, a gate electrode metal is formed on the first or second work function tuning layer. In an embodiment, a metal element from the metal phosphate is embedded in the first gate dielectric layer. In an embodiment, the first gate dielectric layer and the first self-protective layer share a common metal element. In an embodiment, the common metal element is at least one of Ta, Ti, Hf, Zr, or a combination thereof. In an embodiment, the second gate dielectric layer and the second self-protective layer share common silicon elements. In an embodiment, the silicon elements from the second gate dielectric layer and the second self-protective layer form the boron comprising complex agents in the second self-protective layer. In an embodiment, the boron comprising complex agents are silicon-boronate complex agents. In an embodiment, the first material of the first gate dielectric layer is a Ta containing material. In an embodiment, the second material of the second gate dielectric layer is silicon containing material. In an embodiment, the first material of the first gate dielectric layer is at least one of TaN, TaON, TaO, HfN, ZrN, or a combination thereof and the second material of the second gate dielectric layer is at least one of TaSiN, TiSiN, WSiN, HfSiN, ZrSiN, or a combination thereof. In an embodiment, the first and the second self-protective layers have a thickness in a range from 10 Å to 20 Å.

In another embodiment, a semiconductor device structure includes a gate structure formed on a substrate, wherein the gate structure comprises a gate dielectric layer, a self-protective layer on the gate dielectric layer, the self-protective layer comprising metal phosphate or boron comprising complex agents, wherein the metal phosphate has a common metal element with the gate dielectric layer or the boron comprising complex agents as a common silicon element with the gate dielectric layer, and a work function tuning layer formed on the self-protective layer. In an embodiment, the boron comprising complex agents comprise silicon-boronate complex agents. In an embodiment, the self-protective layers have a thickness in a range from 10 Å to 20 Å. In an embodiment, the gate dielectric layer further comprises a first portion comprising the metal elements and a second portion comprising the silicon elements.

In yet another embodiment, a method for forming a semiconductor device includes patterning a work function tuning layer on first and second gate dielectric layers disposed on a substrate using an etching solution, wherein the etching solution includes phosphoric acid, boric acid, and hydrogen peroxide in an acid solution, wherein the first and the second gate dielectric layers each comprises different types of materials, and upon removal of the work function tuning layer from the first and second gate dielectric layers, forming a first and a second self-protective layers on the first and the second gate dielectric layers respectively by exposing the first and the second gate dielectric layers to the etching solution. In an embodiment, the first self-protective layer comprises metal phosphate and the second self-protective layer comprises boron comprising complex agents, the metal phosphate and the boron comprising complex agent having the metal and silicon elements sourced from the first and the second gate dielectric layers, respectively. In an embodiment, the method of claim 18, wherein a concentration ratio of phosphoric acid to boric acid in the etching solution is in a range from 1:5 to 5:1 by volume.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device, comprising:
a first gate structure and a second gate structure on a substrate; wherein the first gate structure includes a first gate dielectric layer having a first material, and the second gate structure includes a second gate dielectric layer having a second material, the first material being different from the second material, wherein the first and the second gate structures further comprise:
a first and a second self-protective layers disposed on the first and the second gate dielectric layers respectively, wherein the first self-protective layer comprises metal phosphate and the second self-protective layer comprises boron comprising complex agents; and
a first work function tuning layer on the first self-protective layer in the first gate structure.

2. The semiconductor device of claim 1, wherein the second gate structure further comprises:
a second work function tuning layer on the second self-protective layer in the second gate structure.

3. The semiconductor device of claim 2, further comprising:
a gate electrode metal on the first or second work function tuning layer.

4. The semiconductor device of claim 1, wherein a metal element from the metal phosphate is embedded in the first gate dielectric layer.

5. The semiconductor device of claim 1, wherein the first gate dielectric layer and the first self-protective layer share a common metal element.

6. The semiconductor device of claim 5, wherein the common metal element is at least one of Ta, Ti, Hf, Zr, or a combination thereof.

7. The semiconductor device of claim 1, wherein the second gate dielectric layer and the second self-protective layer share common silicon elements.

8. The semiconductor device of claim 7, wherein the silicon elements from the second gate dielectric layer and the second self-protective layer form the boron comprising complex agents in the second self-protective layer.

9. The semiconductor device of claim 8, wherein the boron comprising complex agents are silicon-boronate complex agents.

10. The semiconductor device of claim 1, wherein the first material of the first gate dielectric layer is a Ta containing material.

11. The semiconductor device of claim 1, wherein the second material of the second gate dielectric layer is silicon containing material.

12. The semiconductor device of claim 1, wherein the first material of the first gate dielectric layer is at least one of TaN, TaON, TaO, HfN, ZrN, or a combination thereof and the second material of the second gate dielectric layer is at least one of TaSiN, TiSiN, WSiN, HfSiN, ZrSiN, or a combination thereof.

13. The semiconductor device of claim 1, wherein the first and the second self-protective layers have a thickness in a range from 10 Å to 20 Å.

14. A semiconductor device structure, comprising:
a gate structure formed on a substrate, wherein the gate structure comprises:
a gate dielectric layer;
a self-protective layer on the gate dielectric layer, the self-protective layer comprising metal phosphate or boron comprising complex agents, wherein the metal phosphate has a common metal element with the gate dielectric layer or the boron comprising complex agents has a common silicon element with the gate dielectric layer; and
a work function tuning layer formed on the self-protective layer.

15. The semiconductor device structure of claim 14, wherein the boron comprising complex agents comprise silicon-boronate complex agents.

16. The semiconductor device structure of claim 15, wherein the self-protective layer has a thickness in a range from 10 Å to 20 Å.

17. The semiconductor device structure of claim 15, wherein the gate dielectric layer further comprises a first portion comprising the metal element and a second portion comprising the silicon element.

18. A semiconductor device, comprising:
a first gate structure over a first fin, the first gate structure disposed in a P-type device region, wherein the first gate structure comprises:

a first gate dielectric layer over the first fin;

a first self-protective layer over the first gate dielectric layer, the first self-protective layer comprising metal phosphate; and a first work function layer over the first self-protective layer; and a second gate structure over the first fin, the second gate structure disposed in an N-type device region, wherein the second gate structure comprises:

a second gate dielectric layer over the first fin, the second gate dielectric layer having a different composition from the first gate dielectric layer;

a second self-protective layer over the second gate dielectric layer, the second self-protective layer comprising silicon-boron complex agents; and the first work function layer over the second self-protective layer.

19. The semiconductor device of claim 18, wherein the first gate dielectric layer and the first self-protective layer share a common metal element, wherein the second gate dielectric layer and the second self-protective layer share a common silicon element.

20. The semiconductor device of claim 19, wherein the first gate dielectric layer comprises tantalum (Ta), zirconium (Zr), or hafnium (Hf), and the second gate dielectric layer comprises silicon (Si).

* * * * *